(12) United States Patent
Wang et al.

(10) Patent No.: US 12,094,792 B2
(45) Date of Patent: Sep. 17, 2024

(54) PACKAGE STRUCTURE HAVING LID WITH PROTRUSION AND MANUFACTURING METHOD THEREOF

(71) Applicant: Taiwan Semiconductor Manufacturing Company, Ltd., Hsinchu (TW)

(72) Inventors: Kuan-Min Wang, Hsinchu (TW); Chang-Jung Hsueh, Taipei (TW); Jui-Chang Chuang, Hsinchu (TW); Wei-Hung Lin, Hsinchu County (TW); Kuo-Chin Chang, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 165 days.

(21) Appl. No.: 17/461,818

(22) Filed: Aug. 30, 2021

(65) Prior Publication Data

US 2023/0065147 A1    Mar. 2, 2023

(51) Int. Cl.
*H01L 23/29* (2006.01)
*H01L 23/31* (2006.01)

(52) U.S. Cl.
CPC ........ *H01L 23/293* (2013.01); *H01L 23/3142* (2013.01); *H01L 2924/16153* (2013.01)

(58) Field of Classification Search
CPC ......... H01L 23/02–10; H01L 2924/161–1616; H01L 2924/16152; H01L 2924/16153
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2007/0045819 A1* | 3/2007 | Edwards | H01L 23/10 257/E23.087 |

(Continued)

FOREIGN PATENT DOCUMENTS

| | | |
|---|---|---|
| TW | 201903996 | 1/2019 |
| TW | 201913920 | 4/2019 |

OTHER PUBLICATIONS

"Office Action of Taiwan Counterpart Application", issued on Jun. 24, 2022, p. 1-p. 5.

*Primary Examiner* — Laura M Menz
*Assistant Examiner* — Candice Chan
(74) *Attorney, Agent, or Firm* — JCIPRNET

(57) ABSTRACT

A semiconductor package includes a substrate, a semiconductor die, a lid, and an adhesive layer. The semiconductor die is attached to the substrate. The lid is over the semiconductor die and the substrate. The adhesive layer is sandwiched between the lid and the semiconductor die. The adhesive layer includes a metallic thermal interface material (TIM) layer and a polymeric TIM layer adjacent to the metallic TIM layer. The polymeric TIM layer is located on corners of the semiconductor die from a top view.

20 Claims, 26 Drawing Sheets

(56) References Cited

U.S. PATENT DOCUMENTS

| | | | |
|---|---|---|---|
| 2016/0233141 A1* | 8/2016 | Hirobe | H01L 23/10 |
| 2018/0350755 A1* | 12/2018 | Huang | H01L 25/18 |
| 2020/0227336 A1* | 7/2020 | Eid | H01L 23/42 |
| 2020/0411407 A1* | 12/2020 | Dubey | H01L 25/0652 |
| 2021/0242098 A1 | 8/2021 | Sinha et al. | |
| 2021/0242139 A1 | 8/2021 | Sinha et al. | |

* cited by examiner

PACKAGE STRUCTURE HAVING LID WITH PROTRUSION AND MANUFACTURING METHOD THEREOF

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
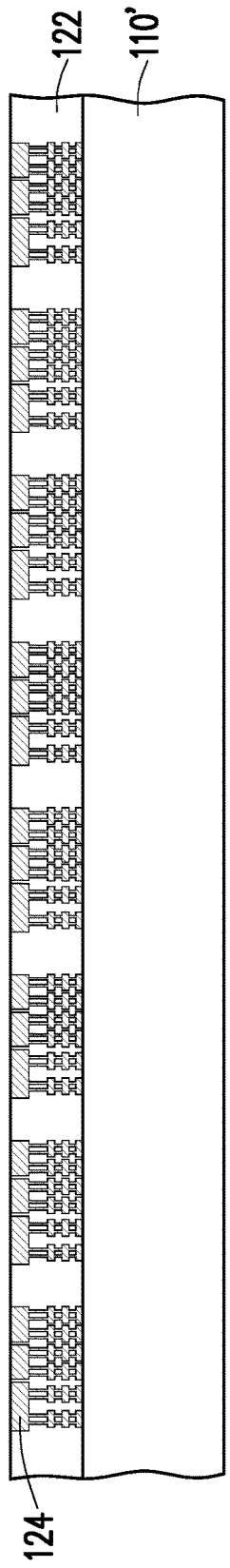
FIG. 1A to FIG. 1H are schematic cross-sectional views illustrating a manufacturing process of a semiconductor die in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a manufacturing process of a semiconductor die 100 in accordance with some embodiments of the disclosure. Referring to FIG. 1A, a semiconductor wafer 110' is provided. In some embodiments, the semiconductor wafer 110' is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and passive components (e.g., resistors, capacitors, inductors, or the like) formed therein.

In some embodiments, an interconnection structure 120 is formed on the semiconductor wafer 110'. In some embodiments, the interconnection structure 120 includes an inter-dielectric layer 122 and a plurality of patterned conductive layers 124. For simplicity, the inter-dielectric layer 122 is illustrated as a bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two adjacent patterned conductive layers 124 are electrically connected to each other through conductive vias sandwiched therebetween.

In some embodiments, a material of the inter-dielectric layer 122 includes polyimide, epoxy resin, acrylic resin, phenol resin, benzocyclobutene (BCB), polybenzoxazole (PBO), or other suitable polymer-based dielectric materials.

The inter-dielectric layer 122 may be formed by suitable fabrication techniques, such as spin-on coating, chemical vapor deposition (CVD), plasma-enhanced chemical vapor deposition (PECVD), or the like. In some embodiments, a material of the patterned conductive layers 124 includes aluminum, titanium, copper, nickel, tungsten, and/or alloys thereof. The patterned conductive layers 124 may be formed by electroplating, deposition, and/or photolithography and etching. It should be noted that the number of the patterned conductive layers 124 and the dielectric layers in the inter-dielectric layer 122 shown in FIG. 1A is merely an exemplary illustration, and the disclosure is not limited. In some alternative embodiments, the number of the patterned conductive layers 124 and the dielectric layers in the inter-dielectric layer 122 may be adjusted depending on the routing requirements.

Figure 1B:
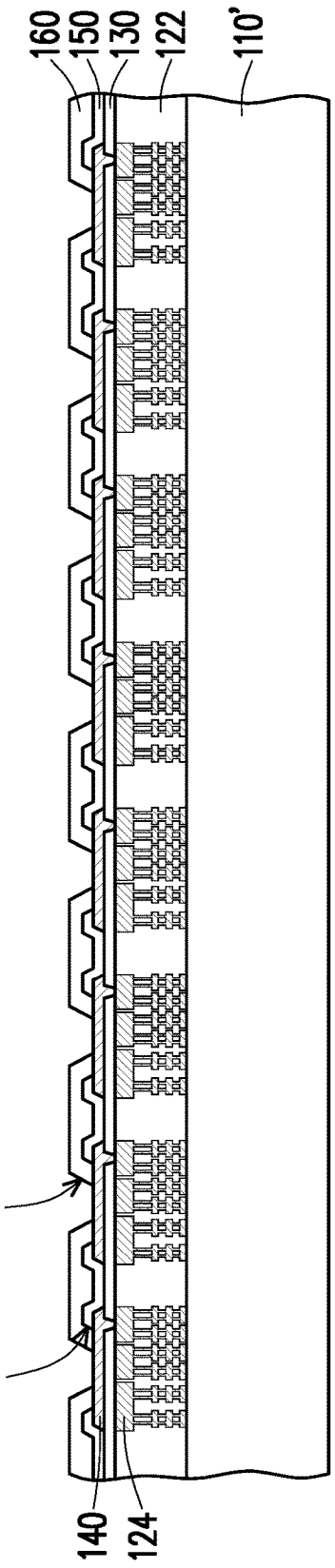

Referring to FIG. 1B, a dielectric layer 130 is formed over the interconnection structure 120. In some embodiments, a material of the dielectric layer 130 includes polyimide, epoxy resin, acrylic resin, phenol resin, BCB, PBO, or any other suitable polymer-based dielectric material. The dielectric layer 130 may be formed by suitable fabrication techniques, such as spin-on coating, CVD, PECVD, or the like. In some embodiments, a plurality of openings is formed in the dielectric layer 130 to expose portions of the topmost patterned conductive layer 124. After the openings are formed, a plurality of conductive pads 140 is formed over the dielectric layer 130. For example, the conductive pads 140 are formed over the semiconductor wafer 110' and the interconnection structure 120 such that the interconnection structure 120 is located between the semiconductor wafer 110' and the conductive pads 140. In some embodiments, the locations of the conductive pads 140 correspond to the locations of the openings of the dielectric layer 130. For example, the conductive pads 140 extend into the openings of the dielectric layer 130 to render electrical connection between the conductive pads 140 and portions of the interconnection structure 120 (i.e. the patterned conductive layer 124). In some embodiments, the conductive pads 140 are aluminum pads, copper pads, or other suitable metal pads. The number and the shape of the conductive pads 140 may be selected based on demand.

After the conductive pads 140 are distributed over the dielectric layer 130, a passivation layer 150 and a post-passivation layer 160 are sequentially formed over the dielectric layer 130 and the conductive pads 140. In some embodiments, the passivation layer 150 has a plurality of contact openings OP1 which partially exposes the conductive pads 140. In some embodiments, the passivation layer 150 is a silicon oxide layer, a silicon nitride layer, a silicon oxy-nitride layer, or a dielectric layer formed by other suitable dielectric materials. As illustrated in FIG. 1B, the post-passivation layer 160 covers the passivation layer 150 and has a plurality of contact openings OP2. The conductive pads 140 are partially exposed by the contact openings OP2 of the post-passivation layer 160. In some embodiments, the post-passivation layer 160 is a polyimide layer, a PBO layer, or a dielectric layer formed by other suitable polymers. It should be noted that the post-passivation layer 160 may be optional in some embodiments.

Figure 1C:
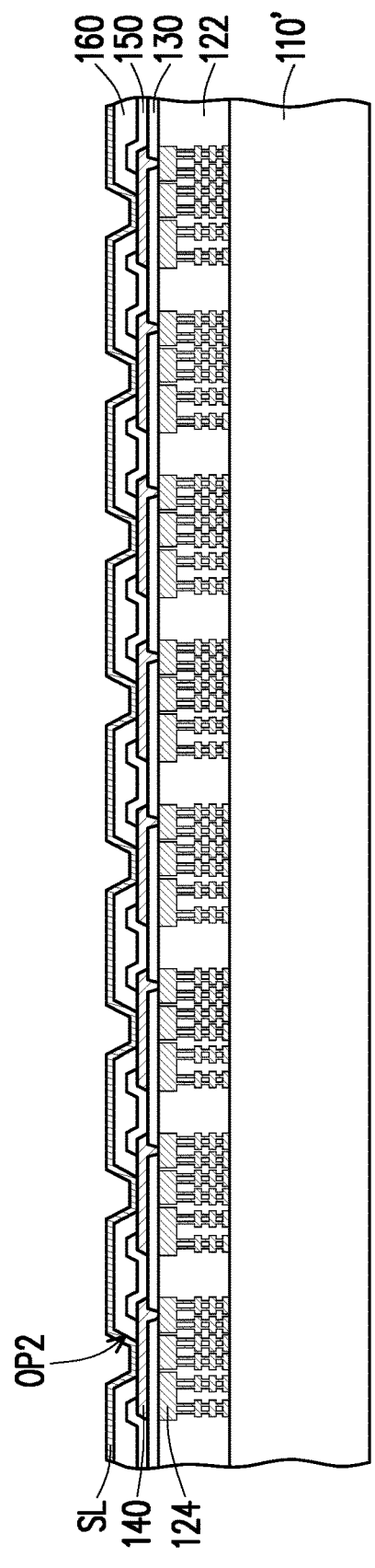

Referring to FIG. 1C, after forming the post-passivation layer 160, a seed layer SL is conformally formed on the post-passivation layer 160. For example, at least a portion of the seed layer SL extends into the contact openings OP2 of the passivation layer 160 to be in physical with the conductive pads 140. The seed layer SL may be formed through a sputtering process, a physical vapor deposition (PVD) process, or the like. In some embodiments, the seed layer SL is constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials.

Figure 1D:
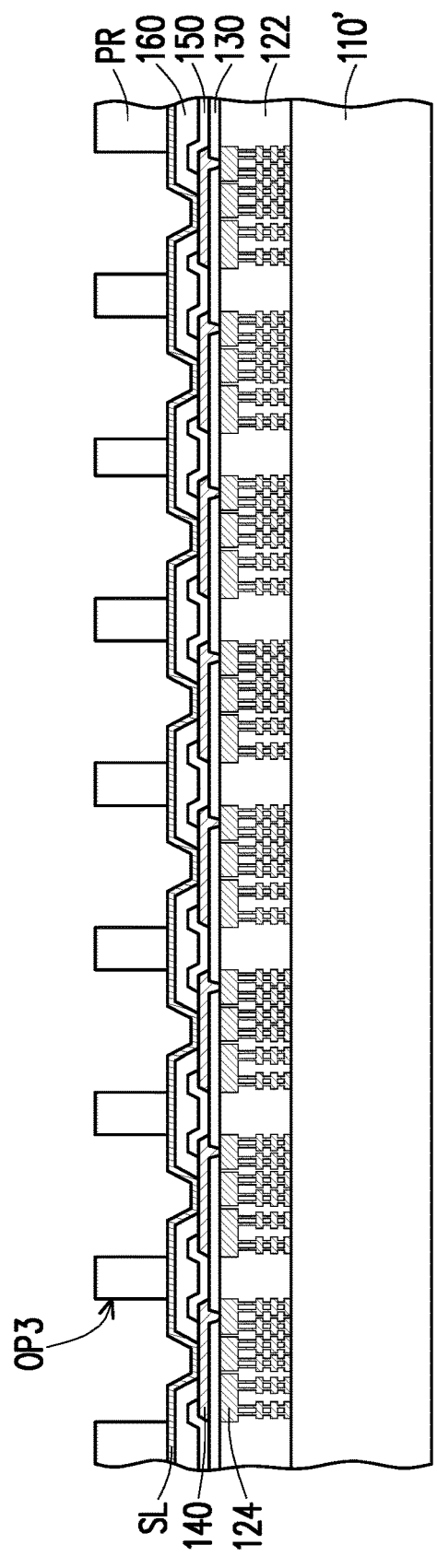

Referring to FIG. 1D, a patterned photoresist layer PR is formed over the seed layer SL. In some embodiments, the patterned photoresist layer PR is made of a photosensitive material. In some embodiments, the patterned photoresist layer PR has a plurality of openings OP3 partially exposing the seed layer SL above the contact pads 140. For example, the openings OP3 expose the seed layer SL located directly above the contact pads 140.

Figure 1E:
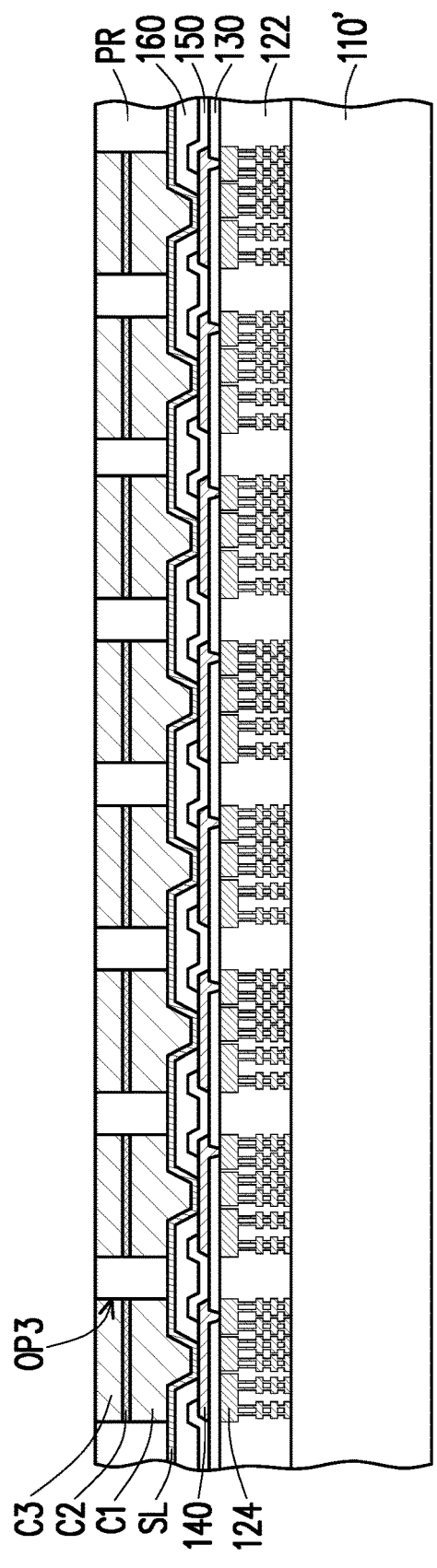

Referring to FIG. 1E, a first conductive layer C1, a second conductive layer C2, and a third conductive layer C3 are sequentially deposited onto the exposed seed layer SL. For example, the first conductive layer C1, the second conductive layer C2, and the third conductive layer C3 are filled into the openings OP3 of the patterned photoresist layer PR. In some embodiments, the first conductive layer C1, the second conductive layer C2, and the third conductive layer C3 are formed through the same technique. However, the disclosure is not limited thereto. In some alternative embodiments, the first conductive layer C1, the second conductive layer C2, and the third conductive layer C3 may be formed by different techniques. In some embodiments, the first conductive layer C1, the second conductive layer C2, and the third conductive layer C3 are formed through a plating process. The plating process is, for example, an electroplating process, an electroless-plating process, an immersion plating process, or the like. In some embodiments, materials of the first conductive layer C1, the second conductive layer C2, and the third conductive layer C3 are different. For example, the first conductive layer C1 is made of aluminum, titanium, copper, tungsten, and/or alloys thereof. On the other hand, the second conductive layer C2 is made of nickel. Moreover, the third conductive layer C3 is made of solder. In some embodiments, a thickness of the first conductive layer C1 is greater than a thickness of the second conductive layer C2 and a thickness of the third conductive layer C3. On the other hand, the thickness of third conductive layer C3 is greater than the thickness of the second conductive layer C2.

Figure 1F:
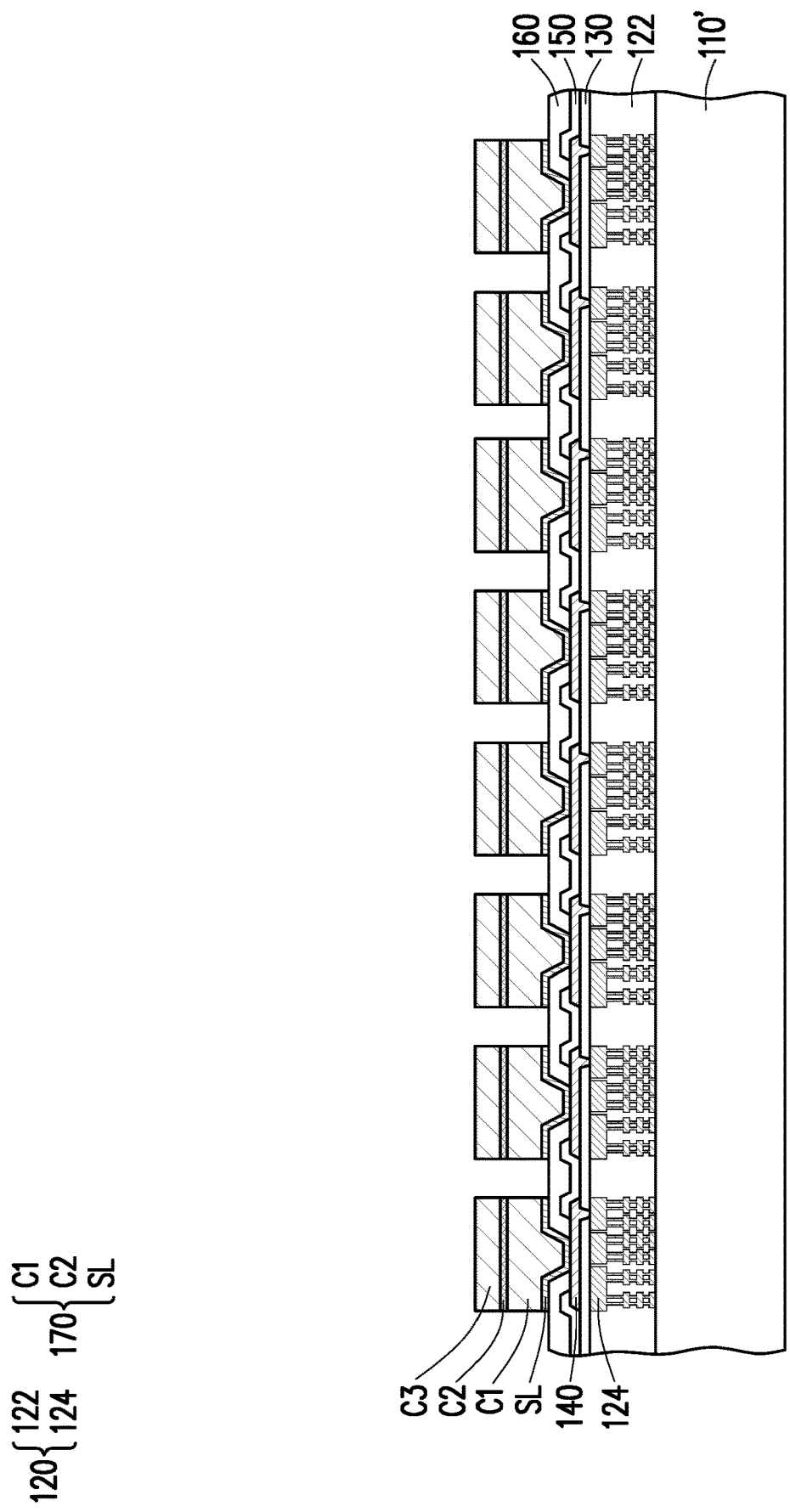

Referring to FIG. 1E and FIG. 1F, the patterned photoresist layer PR is removed. The patterned photoresist layer PR may be removed through an etching process, a stripping process, an ashing process, a combination thereof, or the like. Thereafter, by using the first conductive layer C1, the second conductive layer C2, and the third conductive layer C3 as hard masks, the seed layer SL that is uncovered by the first conductive layer C1, the second conductive layer C2, and the third conductive layer C3 is removed. In some embodiments, portions of the seed layer SL are removed through an etching process. After removal of portions of the seed layer SL, the remaining seed layer SL is located directly underneath the first conductive layer C1. That is, the seed layer SL is sandwiched between the contact pads 140 and the first conductive layer C1. In some embodiments, the remaining seed layer SL, the first conductive layer C1, and the second conductive layer C2 are collectively referred to as conductive posts 170.

Figure 1G:
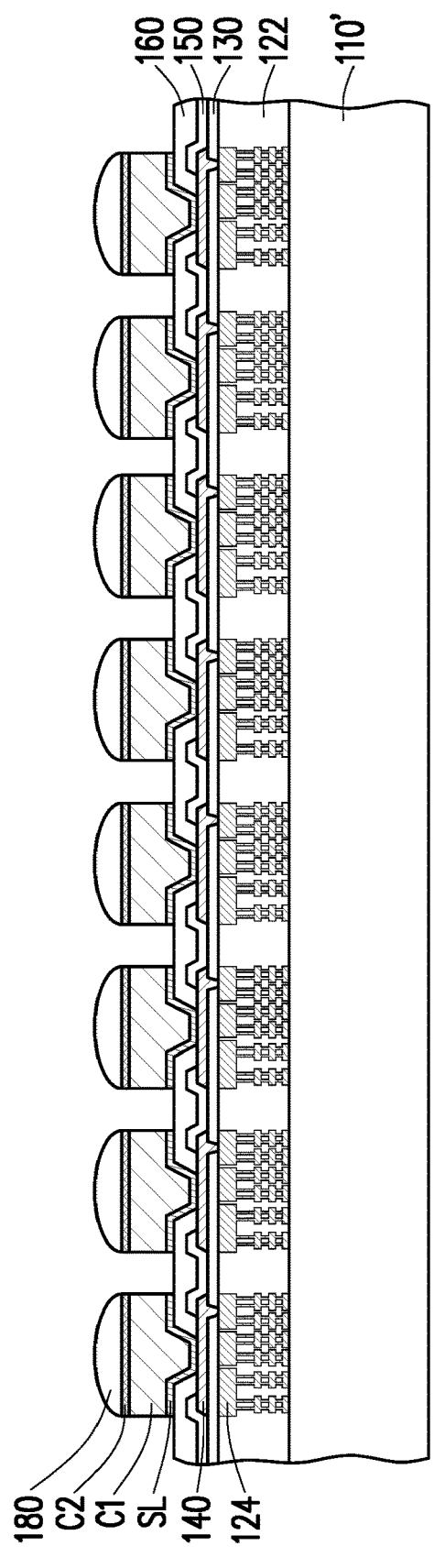

Referring to FIG. 1F and FIG. 1G, a reflow process is performed on the third conductive layer C3 to transform the third conducive layer C3 into conductive terminals 180. That is, the conductive terminals 180 are formed on the conductive posts 170. In some embodiments, the third conductive layer C3 is reshaped during the reflow process to form hemispherical conductive terminals 180.

Figure 1H:
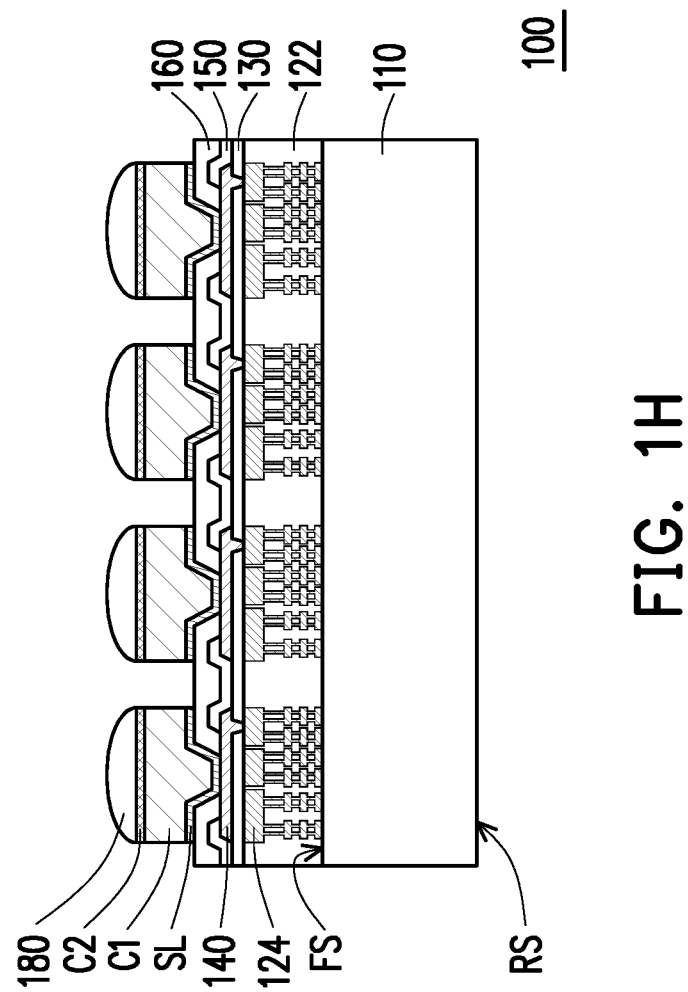

Referring to FIG. 1G and FIG. 1H, the structure illustrated in FIG. 1G is singulated to render a plurality of semiconductor dies 100 shown in FIG. 1H. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1G to form trenches (not shown) in the said structure. Thereafter, a mechanical cutting process may be performed on the locations of the trenches to cut through the said structure, so as to divide the semiconductor wafer 110' into semiconductor substrates 110 and to obtain the semiconductor die 100.

As illustrated in FIG. 1H, the semiconductor die 100 includes the semiconductor substrate 110, the interconnection structure 120, the dielectric layer 130, the conductive pads 140, the passivation layer 150, the post-passivation layer 160, the conductive posts 170, and the conductive terminals 180. In some embodiments, the semiconductor substrate 110 has a front surface FS and a rear surface RS opposite to the front surface FS. The interconnection structure 120 is disposed on the front surface FS of the semiconductor substrate 110. The dielectric layer 130, the conductive pads 140, the passivation layer 150, and the post-passivation layer 160 are sequentially disposed over the interconnection structure 120. The conductive posts 170 are disposed over the post-passivation layer 160 and are electrically connected to the conductive pads 140. The conductive terminals 180 are disposed on the conductive posts 170.

In some embodiments, the semiconductor die 100 may be utilized in a package structure. For example, the semiconductor die 100 may be assembled with other components to form a semiconductor package. The manufacturing process of the semiconductor package utilizing the semiconductor die 100 will be described below.

Figure 2A:
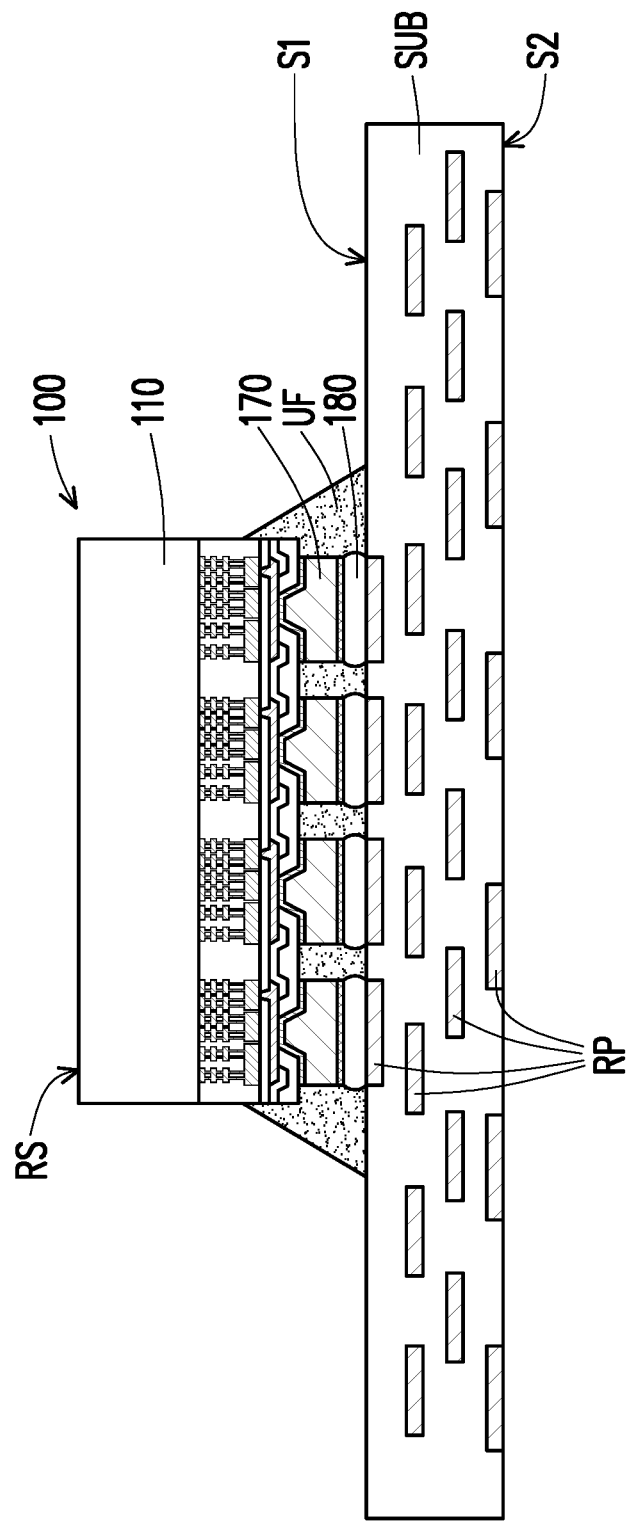
FIG. 2A to FIG. 2F are schematic cross-sectional views illustrating a manufacturing process of a semiconductor package in accordance with some embodiments of the disclosure.

FIG. 2A to FIG. 2F are schematic cross-sectional views illustrating a manufacturing process of a semiconductor package 10 in accordance with some embodiments of the disclosure. Referring to FIG. 2A, a substrate SUB is provided. In some embodiments, the substrate SUB is a printed circuit board (PCB) or the like. In some embodiments, the substrate SUB is referred to as a circuit substrate. In some embodiments, the substrate SUB includes a plurality of routing patterns RP embedded therein. In some embodiments, the routing patterns RP are interconnected with one another. That is, the routing patterns RP are electrically connected to one another. As illustrated in FIG. 2A, the substrate SUB has a first surface S1 and a second surface S2 opposite to the first surface S1. In some embodiments, some of the routing patterns RP are exposed at the first surface S1 and some of the routing patterns RP are exposed at the second surface S2.

As illustrated in FIG. 2A, the semiconductor die 100 in FIG. 1H is bonded to the first surface S1 of the substrate SUB. In some embodiments, the semiconductor die 100 is attached to the substrate SUB through the conductive terminals 180. For example, the conductive terminals 180 of the semiconductor die 100 are in physical contact with the routing patterns RP exposed at the first surface S1 of the substrate SUB to render electrical connection between the semiconductor die 100 and the substrate SUB. In some embodiments, after the conductive terminals 180 are attached to the routing patterns RP of the substrate SUB, a reflow process may be performed to reshape the conductive terminals 180.

In some embodiments, the semiconductor die 100 is attached to the substrate SUB through flip-chip bonding. In other words, the semiconductor die 100 is placed such that the rear surface RS of the semiconductor substrate 110 faces upward. It should be noted that although FIG. 2A illustrated that the semiconductor 100 in FIG. 1H is attached to the substrate SUB, the disclosure is not limited thereto. In some alternative embodiments, other semiconductor dies may be attached to the substrate SUB.

In some embodiments, an underfill layer UF is formed between the semiconductor die 100 and the first surface S1 of the substrate SUB. For example, the underfill layer UF wraps around the conductive posts 170 and the conductive terminals 180 of the semiconductor die 100. In some embodiments, the underfill layer UF is utilized to protect these elements. In some embodiments, the underfill layer UF further covers portions of each sidewall of the semiconductor die 100. In some embodiments, a material of the underfill layer UF is an insulating material and includes a resin (e.g., epoxy resin), a filler material, a stress release agent (SRA), an adhesion promoter, other material, or a combination thereof. In some embodiments, the underfill layer UF is optional.

Figure 2B:
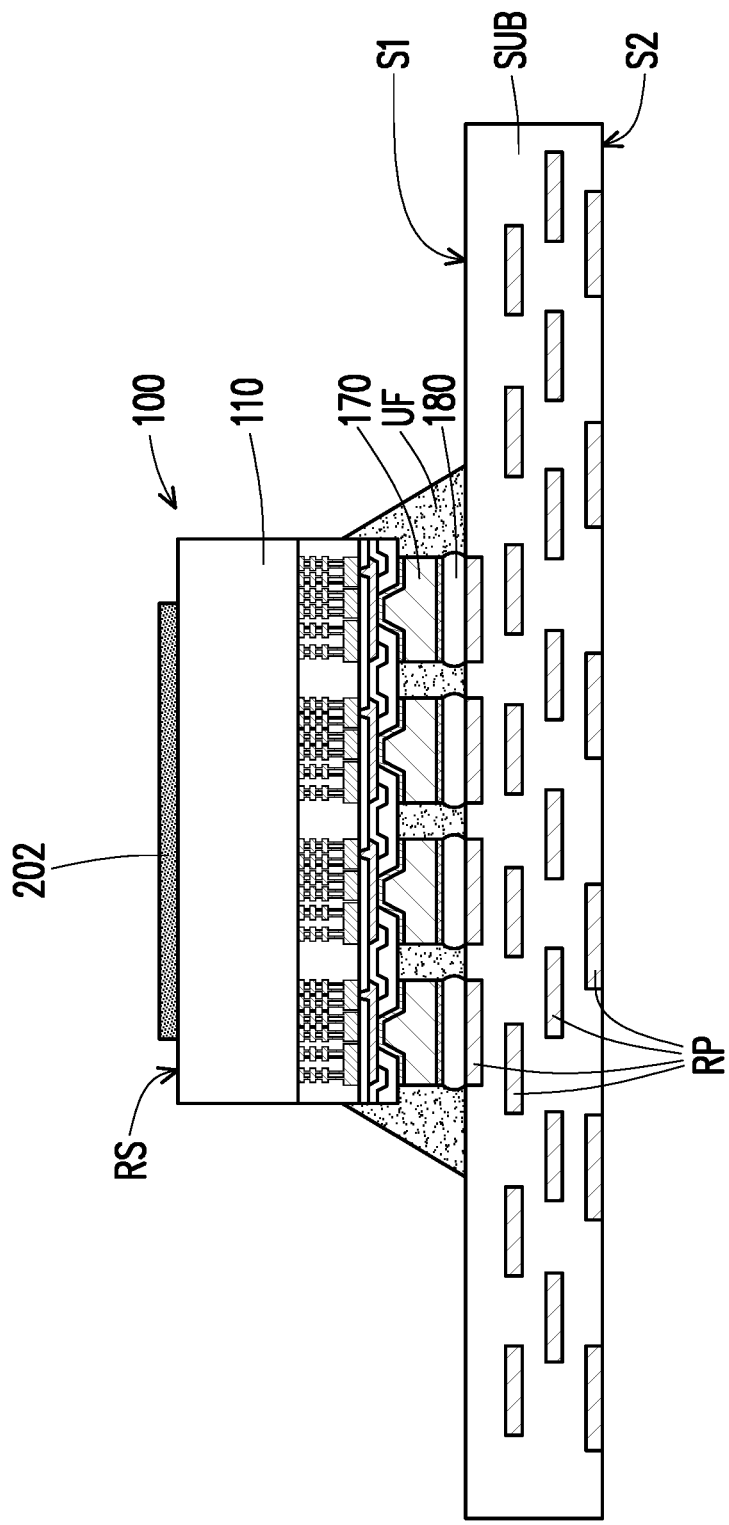

Referring to FIG. 2B, a first metal layer 202 is formed on the rear surface RS of the semiconductor substrate 110 of the semiconductor die 100. In some embodiments, the first metal layer 202 includes gallium. That is, in some embodiments, the first metal layer 202 is referred to as a gallium layer. In some embodiments, the first metal layer 202 is formed on the rear surface RS through a dispensing process. As illustrated in FIG. 2B, the first metal layer 202 is formed on a portion of the rear surface RS of the semiconductor substrate 110. In other words, the first metal layer 202 does not occupy the entire rear surface RS of the semiconductor substrate 110. In some embodiments, the first metal layer 202 is formed on a central region of the rear surface RS of the semiconductor substrate 110. On the other hand, the first metal layer 202 exposes a portion of the rear surface RS of the semiconductor substrate 110. For example, the first metal layer 202 may exposes corners and/or edges of the rear surface RS of the semiconductor substrate 110 from a top view.

Figure 2C:
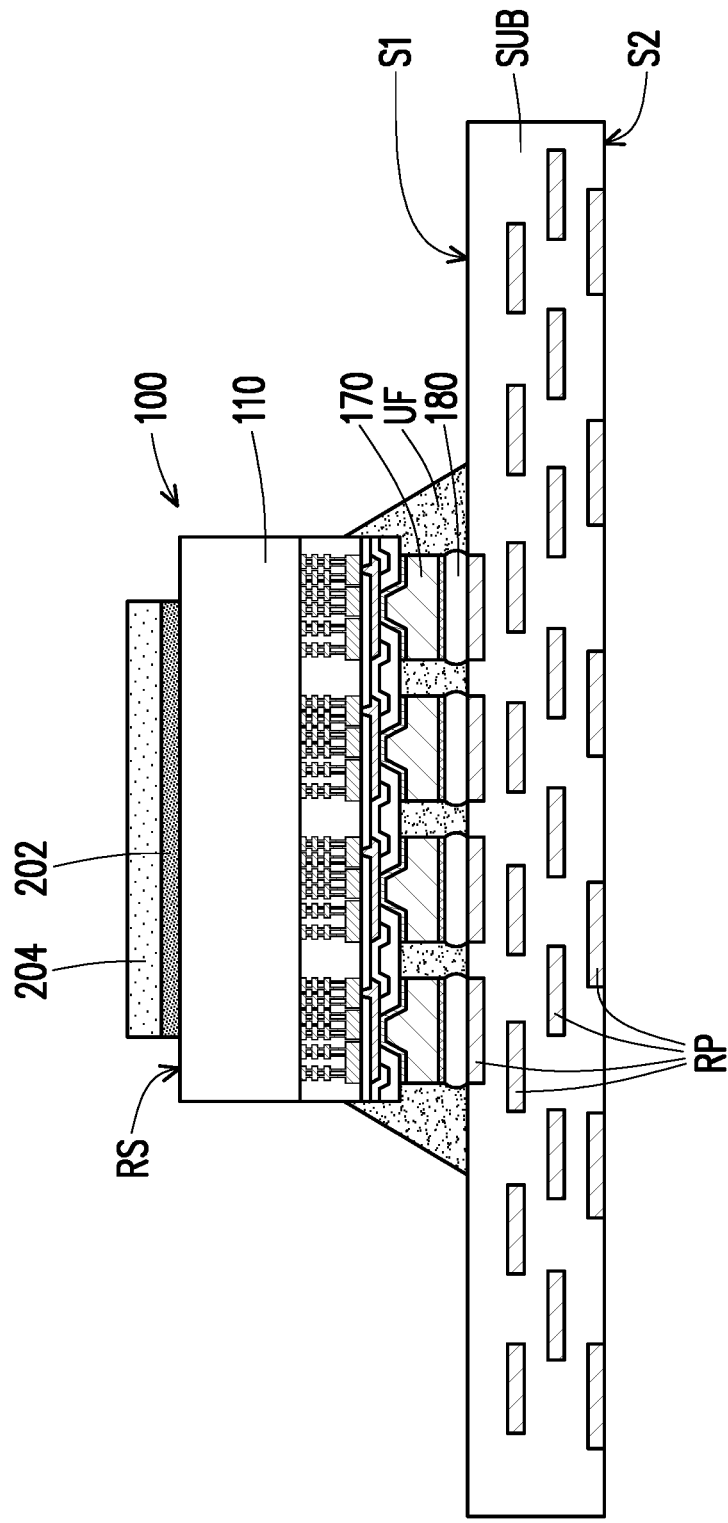

Referring to FIG. 2C, after the first metal layer 202 is formed on the rear surface RS of the semiconductor substrate 110, a metallic thermal interface material (TIM) layer 204 is formed on the first metal layer 202. The metallic TIM layer may be a pre-fabricated film and is placed on the first metal layer 202 through a pasting process. In some embodiments, the metallic TIM layer 204 is formed by purely metallic materials. For example, the metallic TIM layer 204 is free of organic material and polymeric material. In some embodiments, the metallic TIM layer 204 includes solder, tin, bismuth, lead, cadmium, zinc, gallium, indium, tellurium, mercury, thallium, antimony, selenium, polonium, or a combination thereof. In some embodiments, a thermal conductivity (k) of the metallic TIM layer 204 ranges from about 10 W/(m·K) to about 90 W/(m·K). On the other hand, a Young's modulus of the metallic TIM layer 204 ranges from about 5 GPa to about 70 GPa.

In some embodiments, a contour of the metallic TIM layer 204 is substantially identical to a contour of the first metal layer 202. In other words, sidewalls of the metallic TIM layer 204 are aligned with sidewalls of the first metal layer 202. That is, the metallic TIM layer 204 also exposes a portion of the rear surface RS of the semiconductor substrate 110. For example, similar to the first metal layer 202, the metallic TIM layer 204 also exposes corners and/or edges of the rear surface RS of the semiconductor substrate 110 from the top view.

Figure 2D:
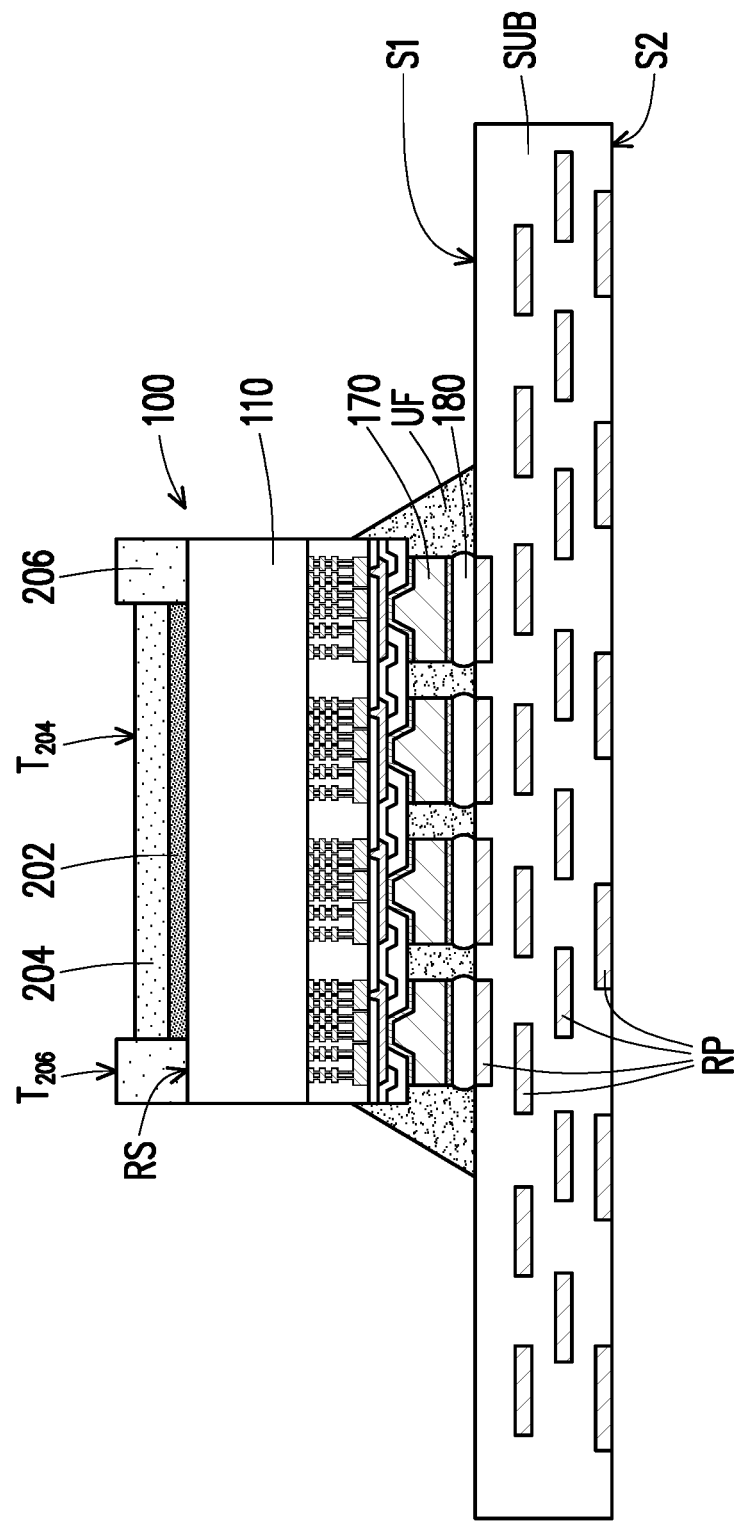

Referring to FIG. 2D, a polymeric TIM layer 206 is formed on the rear surface RS of the semiconductor substrate 110 of the semiconductor die 100. In some embodiments, the polymeric TIM layer 206 is formed on the rear surface RS through a dispensing process. In some embodiments, the polymeric TIM layer 206 includes acetal, acrylic, cellulose, acetate, polyethylene, polystyrene, vinyl, nylon, polyolefin, polyester, silicone, paraffin, or a combination thereof. In some embodiments, the polymeric TIM layer 206 further include fillers. The fillers may facilitate the thermal conduction of the polymeric TIM layer 206. In some embodiments, the fillers are particles made of divinyl benzene crosslinked-polymers, aluminum, copper, silver, beryllium oxide, aluminum nitride, aluminum oxide, zinc oxide, or silicon dioxide. In some embodiments, a thermal conductivity of the polymeric TIM layer 206 is lower than the thermal conductivity of the metallic TIM layer 204. For example, a thermal conductivity of the polymeric TIM layer 206 ranges from about 0.5 W/(m·K) to about 10 W/(m·K). On the other hand, a Young's modulus of the polymeric TIM layer 206 ranges from about 0.04 GPa to about 30 GPa.

In some embodiments, the polymeric TIM layer 206 is formed to be thicker than a combination of the first metal layer 202 and the metallic TIM layer 204. For example, as illustrated in FIG. 2D, a top surface $T_{206}$ of the polymeric TIM layer 206 is located at a level height higher than that of a top surface $T_{204}$ of the metallic TIM layer 204.

In some embodiments, the polymeric TIM layer 206 is formed on the exposed portion of the rear surface RS of the semiconductor substrate 110. That is, the polymeric TIM layer 206 is formed adjacent to the first metal layer 202 and the metallic TIM layer 204 to cover the exposed portion of the rear surface RS of the semiconductor substrate 110. As mentioned above, the exposed portion of the rear surface RS of the semiconductor substrate 110 is corners and/or edges of the rear surface RS of the semiconductor substrate 110 from the top view. As such, the polymeric TIM layer 206 is formed on corners and/or edges of the rear surface RS of the semiconductor substrate 110 of the semiconductor die 100. Various configurations of the metallic TIM layer 204 with respect to the polymeric TIM layer 206 will be described below in conjunction with FIG. 2D and FIG. 3A to FIG. 3D.

Figure 3A:
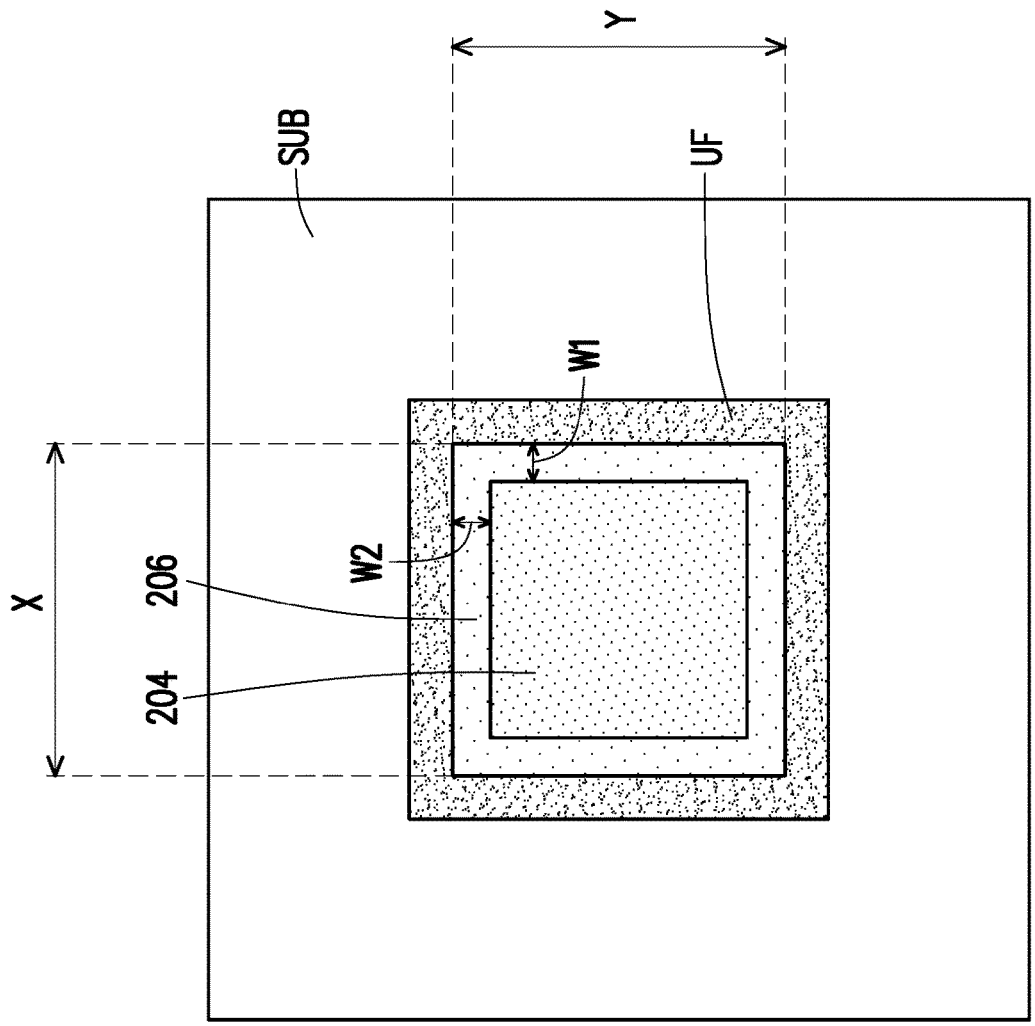
FIG. 3A is a schematic top view of the structure in FIG. 2D.

FIG. 3A is a schematic top view of the structure in FIG. 2D. Referring to FIG. 2D and FIG. 3A, the polymeric TIM layer 206 is a ring pattern from the top view. For example, the polymeric TIM layer 206 extends along edges of the semiconductor substrate 110 to form the ring pattern. In some embodiments, the polymeric TIM layer 206 surrounds the metallic TIM layer 204. For example, the metallic TIM layer 204 fills the region enclosed by the polymeric TIM layer 206. In some embodiments, the polymeric TIM layer 206 covers four corners and four edges of the semiconductor substrate 110 of the semiconductor die 100 from the top view. In general, during the subsequent processes (for example, the subsequent thermal processes), mechanical strain/stress would generate nearby corners of the semiconductor substrate 110 of the semiconductor die 100 to cause delamination of the metallic TIM layer 204. However, as illustrated in FIG. 3A, since the regions directly above the corners of the semiconductor substrate 110 of the semiconductor die 100 are being occupied by the polymeric TIM layer 206, the polymeric TIM layer 206 may serve as a buffer layer to reduce the mechanical strain/stress exerted on the metallic TIM layer 204. For example, with the presence of the polymeric TIM layer 206, the mechanical strain/stress exerted on the metallic TIM layer 204 may be reduced by at least 83% as compared to a scenario where the polymeric TIM layer 206 is absent. As such, the problem of delamination of the metallic TIM layer 204 may be sufficiently alleviated. Moreover, with the presence of the polymeric TIM layer 206 at corners of the semiconductor die 100, warpage derived from shear strength due to coefficient of thermal expansion (CTE) mismatch in the subsequent processes may be reduced. As such, the performance of the subsequently formed semiconductor package may be sufficiently enhanced.

As illustrated in FIG. 3A, the polymeric TIM layer 206 has a first width W1 along a first direction D1 and a second width W2 along a second direction D2 perpendicular to the first direction D1. Meanwhile, the semiconductor substrate 110 has a first width X (i.e. the first width of the semiconductor die 100) along the first direction D1 and a second width Y (i.e. the second width of the semiconductor die 100) along the second direction D2. In some embodiments, a ratio of the first width W1 of the polymeric TIM layer 206 to the first width X of the semiconductor die 100 ranges from about 0.01 to about 0.15. On the other hand, a ratio of the second width W2 of the polymeric TIM layer 206 to the second width Y of the semiconductor die 100 ranges from about 0.01 to about 0.15. In some embodiments, the metallic TIM layer 204 occupies about 50% to about 96% of the total area of the rear surface RS of the semiconductor substrate 110. On the other hand, the polymeric TIM layer 206 occupies about 4% to about 50% of the total area of the rear surface RS of the semiconductor substrate 110. As mentioned above, the thermal conductivity of the polymeric TIM layer 206 is lower than the thermal conductivity of the metallic TIM layer 204. As such, if the polymeric TIM layer 206 occupies too large of the total area of the rear surface RS of the semiconductor substrate 110, the overall thermal conductivity of the metallic TIM layer 204 and the polymeric TIM layer 206 would be decreased, thereby compromising the thermal performance of the subsequently formed semiconductor package. However, by allowing the geometry and the dimension of the polymeric TIM layer 206 to fall within the foregoing ranges, the overall thermal conductivity of the metallic TIM layer 204 and the polymeric TIM layer 206 may be sufficiently maintained. For example, temperatures at the corners of the semiconductor die 100 may be controlled to be lower than temperature at the center of the semiconductor die 100. As such, the problem of delamination of the metallic TIM layer 204 may be resolved without jeopardizing the thermal performance of the subsequently formed semiconductor package.

It should be noted that the configuration shown in FIG. 3A is merely an exemplary arrangement of the metallic TIM layer 204 and the polymeric TIM layer 206. In some alternative embodiments, the metallic TIM layer 204 and the polymeric TIM layer 206 may adopt different arrangements. These arrangements will be described below in conjunction with FIG. 3B to FIG. 3D.

Figure 3B:
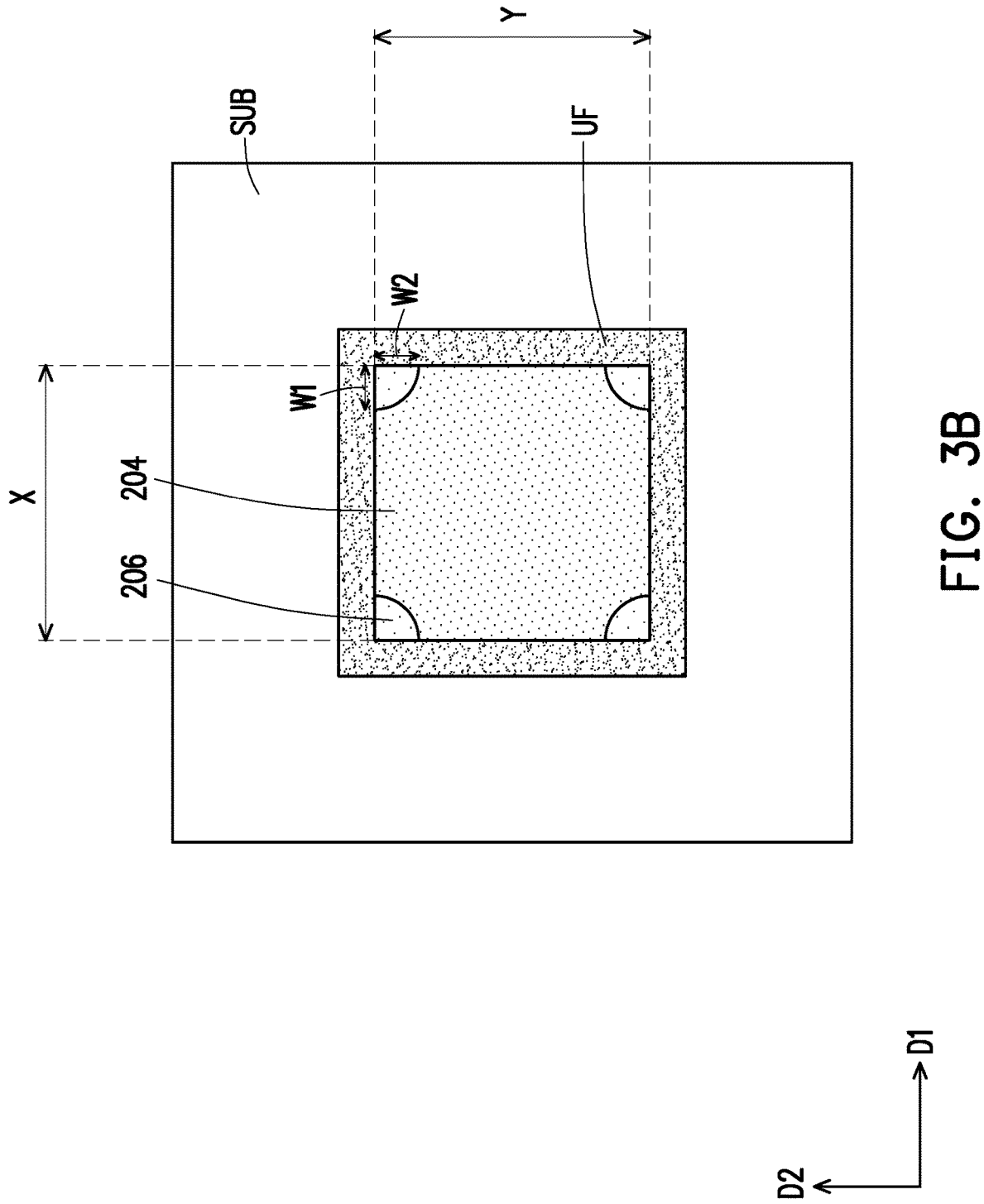
FIG. 3B to FIG. 3D are schematic top views of the structure in FIG. 2D in accordance with some alternative embodiments of the disclosure.
Figure 3C:
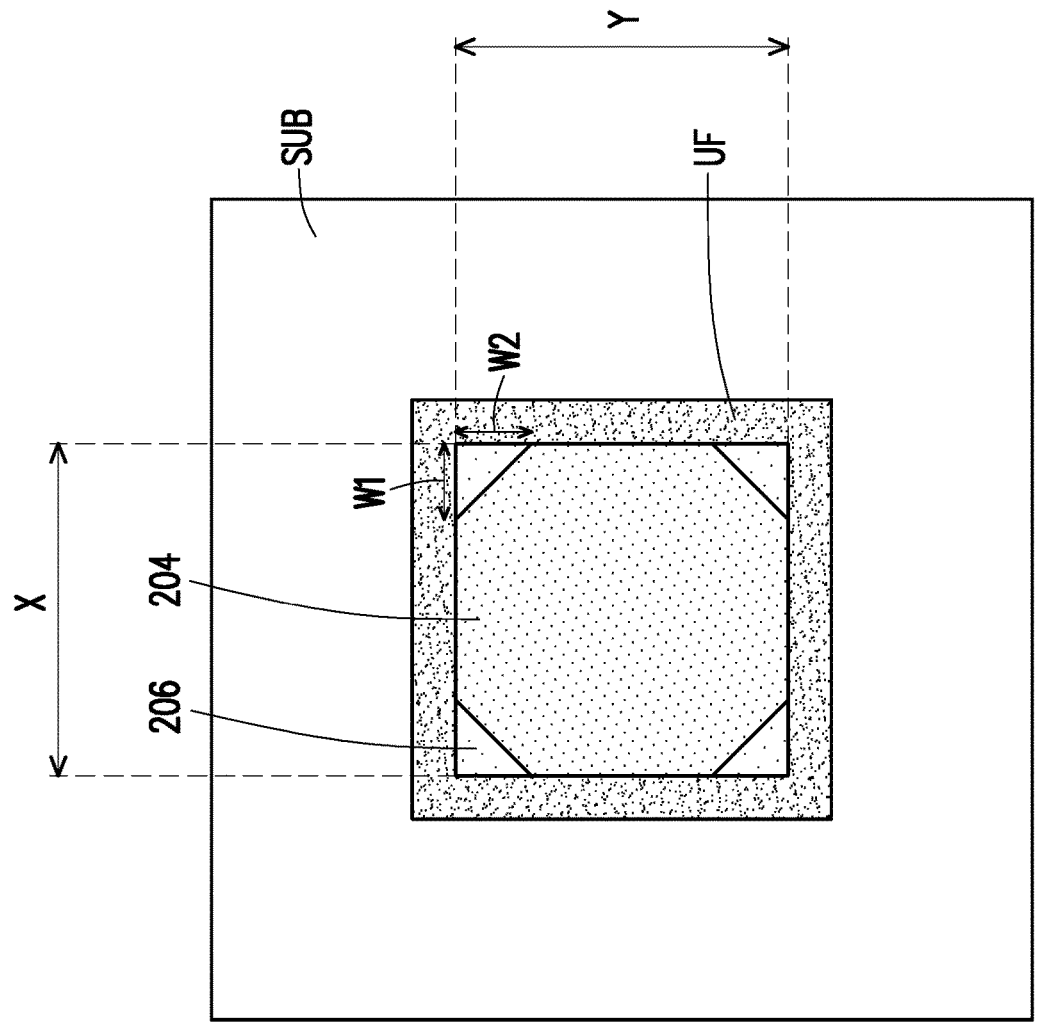
Figure 3D:
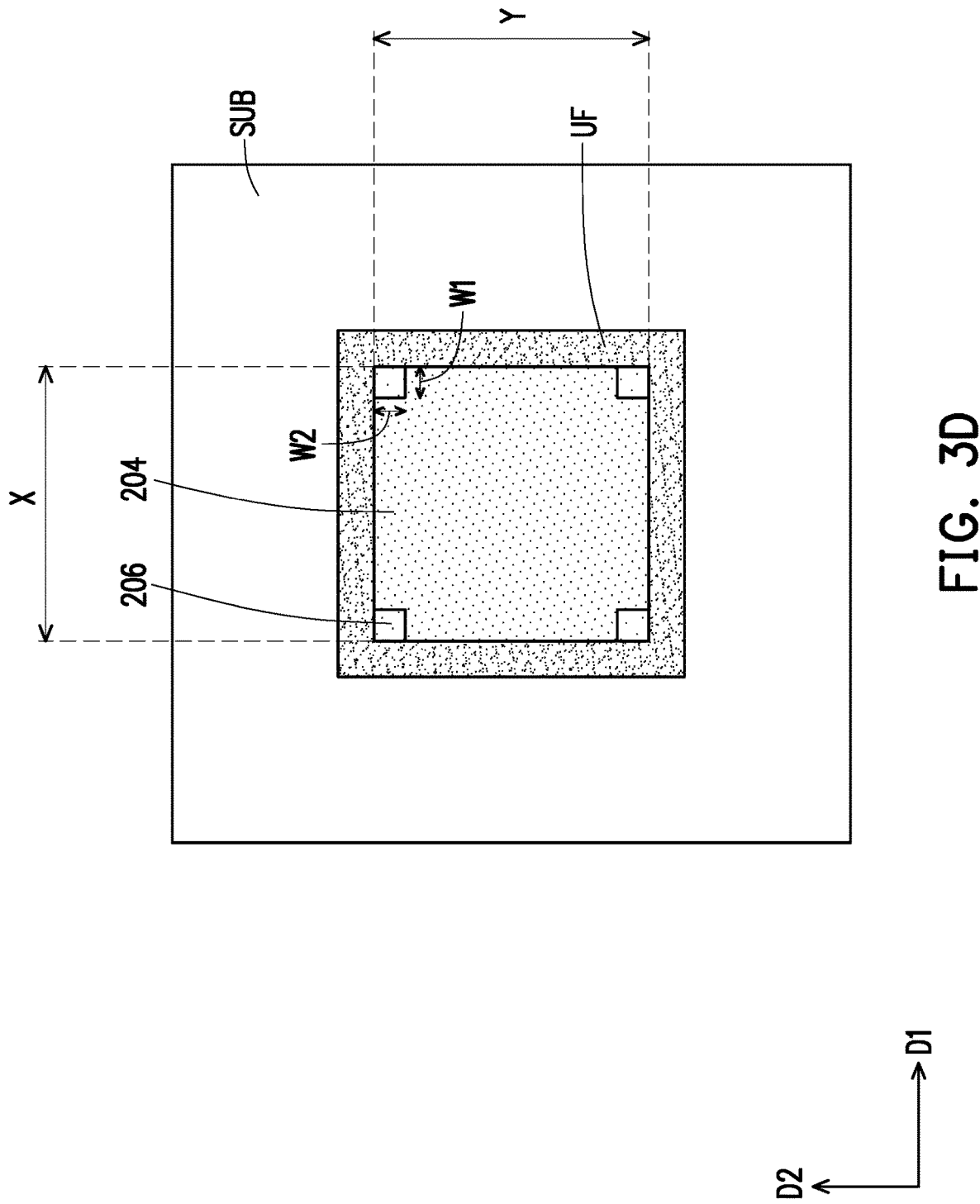

FIG. 3B to FIG. 3D are schematic top views of the structure in FIG. 2D in accordance with some alternative embodiments of the disclosure. Referring to FIG. 3B, the polymeric TIM layer 206 is divided into four discontinuous patterns from the top view. These four discontinuous patterns are respectively located on four corners of the rear surface RS of the semiconductor substrate 110 of the semiconductor die 100 from the top view. On the other hand, the metallic TIM layer 204 covers the region of the rear surface RS of the semiconductor substrate 110 between the discontinuous patterns of the polymeric TIM layer 206. For example, the metallic TIM layer 204 covers a central region of the rear surface RS of the semiconductor substrate 110. Furthermore, the metallic TIM layer 204 also covers edges of the rear surface RS of the semiconductor substrate 110 between the polymeric TIM layer 206. As illustrated in FIG. 3B, each pattern of the polymeric TIM layer 206 exhibits a quadrant shape from the top view. That is, an interface between the metallic TIM layer 204 and the polymeric TIM layer 206 is rounded.

Referring to FIG. 3C, the configuration shown in FIG. 3C is similar to the configuration shown in FIG. 3B, so the detailed description thereof is omitted herein. However, instead of the quadrant shape in FIG. 3B, each pattern of the polymeric TIM layer 206 in FIG. 3C exhibits a triangular shape from the top view. That is, an interface between the metallic TIM layer 204 and the polymeric TIM layer 206 is straight.

Referring to FIG. 3D, the configuration shown in FIG. 3D is similar to the configuration shown in FIG. 3B, so the detailed description thereof is omitted herein. However, instead of the quadrant shape in FIG. 3B, each pattern of the polymeric TIM layer 206 in FIG. 3D exhibits a squared shape from the top view. That is, each pattern of the polymeric TIM layer 206 has two interfaces with the metallic TIM layer 204, and the interfaces are straight.

As illustrated in FIG. 3B to FIG. 3D, since the regions directly above the corners of the semiconductor substrate 110 of the semiconductor die 100 are being occupied by the polymeric TIM layer 206, the polymeric TIM layer 206 may serve as a buffer layer to reduce the mechanical strain/stress exerted on the metallic TIM layer 204. For example, with the presence of the polymeric TIM layer 206, the mechanical strain/stress exerted on the metallic TIM layer 204 may be reduced by at least 83% as compared to a scenario where the polymeric TIM layer 206 is absent. As such, the problem of delamination of the metallic TIM layer 204 may be sufficiently alleviated. Moreover, with the presence of the polymeric TIM layer 206 at corners of the semiconductor die 100, warpage derived from shear strength due to coefficient of thermal expansion (CTE) mismatch in the subsequent processes may be reduced. As such, the performance of the subsequently formed semiconductor package may be sufficiently enhanced.

As illustrated in FIG. 3B to FIG. 3D, the polymeric TIM layer 206 has a first width W1 along a first direction D1 and a second width W2 along a second direction D2 perpendicular to the first direction D1. Meanwhile, the semiconductor substrate 110 has a first width X (i.e. the first width of the semiconductor die 100) along the first direction D1 and a second width Y (i.e. the second width of the semiconductor die 100) along the second direction D2. In some embodiments, a ratio of the first width W1 of the polymeric TIM layer 206 to the first width X of the semiconductor die 100 ranges from about 0.01 to about 0.15. On the other hand, a ratio of the second width W2 of the polymeric TIM layer 206 to the second width Y of the semiconductor die 100 ranges from about 0.01 to about 0.15. In some embodiments, the metallic TIM layer 204 occupies about 50% to about 96% of the total area of the rear surface RS of the semiconductor substrate 110. On the other hand, the polymeric TIM layer 206 occupies about 4% to about 50% of the total area of the rear surface RS of the semiconductor substrate 110. By allowing the geometry and the dimension of the polymeric TIM layer 206 to fall within the foregoing ranges, the overall thermal conductivity of the metallic TIM layer 204 and the polymeric TIM layer 206 may be sufficiently maintained. For example, temperatures at the corners of the semiconductor die 100 may be controlled to be lower than temperature at the center of the semiconductor die 100. As such, the problem of delamination of the metallic TIM layer 204 may be resolved without jeopardizing the thermal performance of the subsequently formed semiconductor package.

Figure 2E:
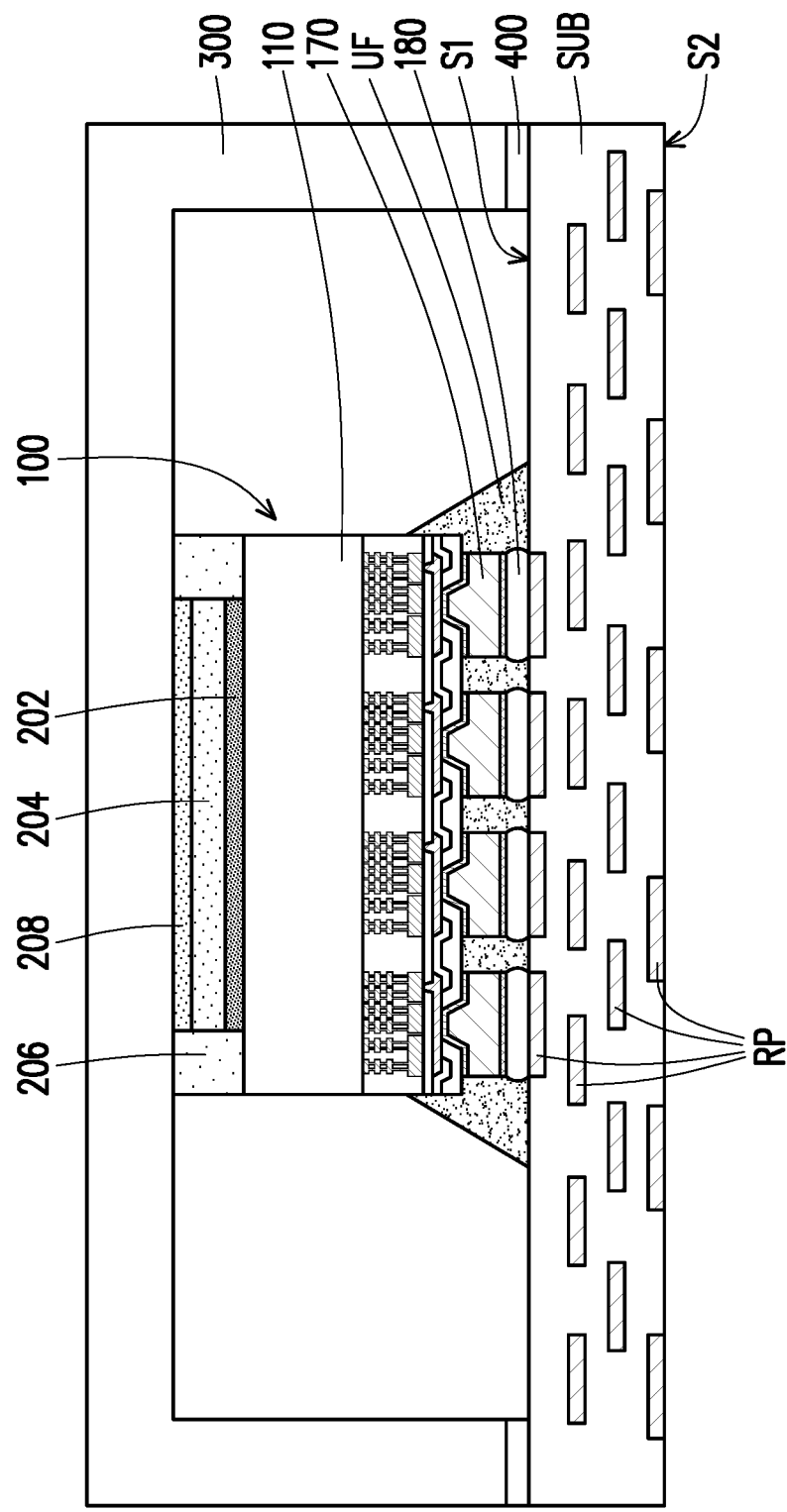

Referring back to FIG. 2E, after the polymeric TIM layer 206 is formed on the semiconductor substrate 110, a lid 300 is attached to the polymeric TIM layer 206 and the substrate SUB. In some embodiments, prior to the attachment of the lid 300, a second metal layer 208 is formed on the lid 300. In some embodiments, a material of the second metal layer 208 is different from a material of the first metal layer 202. For example, the first metal layer 208 includes gold. That is, in some embodiments, the second metal layer 208 is referred to as a gold layer. In some embodiments, the second metal layer 208 is formed on the lid 300 through a dispensing process. After the second metal layer 208 is formed on the lid 300, the lid 300 and the second metal layer 208 are placed above the metallic TIM layer 204 and the polymeric TIM layer 206 with the second metal layer 208 being aligned with the metallic TIM layer 204. Thereafter, the lid 300 and the second metal layer 208 are pressed against the metallic TIM layer 204 and the polymeric TIM layer 206 such that the lid 300 and the second metal layer 208 are adhered to the metallic TIM layer 204 and the polymeric TIM layer 206. In some embodiments, a contour of the second metal layer 208 is substantially identical to the contour of the metallic TIM layer 204 and the contour of the first metal layer 202. As such, sidewalls of the second metal layer 208, the sidewalls of the metallic TIM layer 204, and the sidewalls of the first metal layer 202 are substantially aligned. As illustrated in FIG. 2E, the first metal layer 202 and the second metal layer 208 are on opposite sides of the metallic TIM layer 204. In some embodiments, the first metal layer 202, the metallic TIM layer 204, the polymeric TIM layer 206, and the second metal layer 208 are collectively referred to as an adhesive layer 200. In some embodiments, the material of the first metal layer (i.e. gallium) may further aid the reduction of mechanical stress/strain at the corners of the semiconductor die 100.

As illustrated in FIG. 2E, the lid 300 is over the semiconductor die 100 and the substrate SUB. For example, the lid 300 is attached to the semiconductor die 100 and the substrate SUB. In some embodiments, the lid 300 is attached to the semiconductor die 100 through the adhesive layer 200. That is, the adhesive layer 200 is sandwiched between the semiconductor die 100 and the lid 300. In some embodiments, the lid 300 is attached to the substrate SUB through an adhesive layer 400. For example, the legs of the lid 300 are attached to the substrate SUB through the adhesive layer 400. In some embodiments, the lid 300 is made of a conductive material. For example, a material of the lid 300 includes copper, stainless steel, solder, gold, nickel, molybdenum, NiFe, NiFeCr, an alloy thereof, a combination thereof, or any other suitable conductive material. In some embodiments, the lid 300 is formed to accommodate the semiconductor die 100. For example, the lid 300 may exhibit an upside down U-shape in a cross-sectional view, as shown in FIG. 2E. In some embodiments, the lid 300 serves the function of heat dissipation. In other words, the heat generated during operation of the semiconductor die 100 may be dissipated through the path created by the lid 300.

Figure 2F:
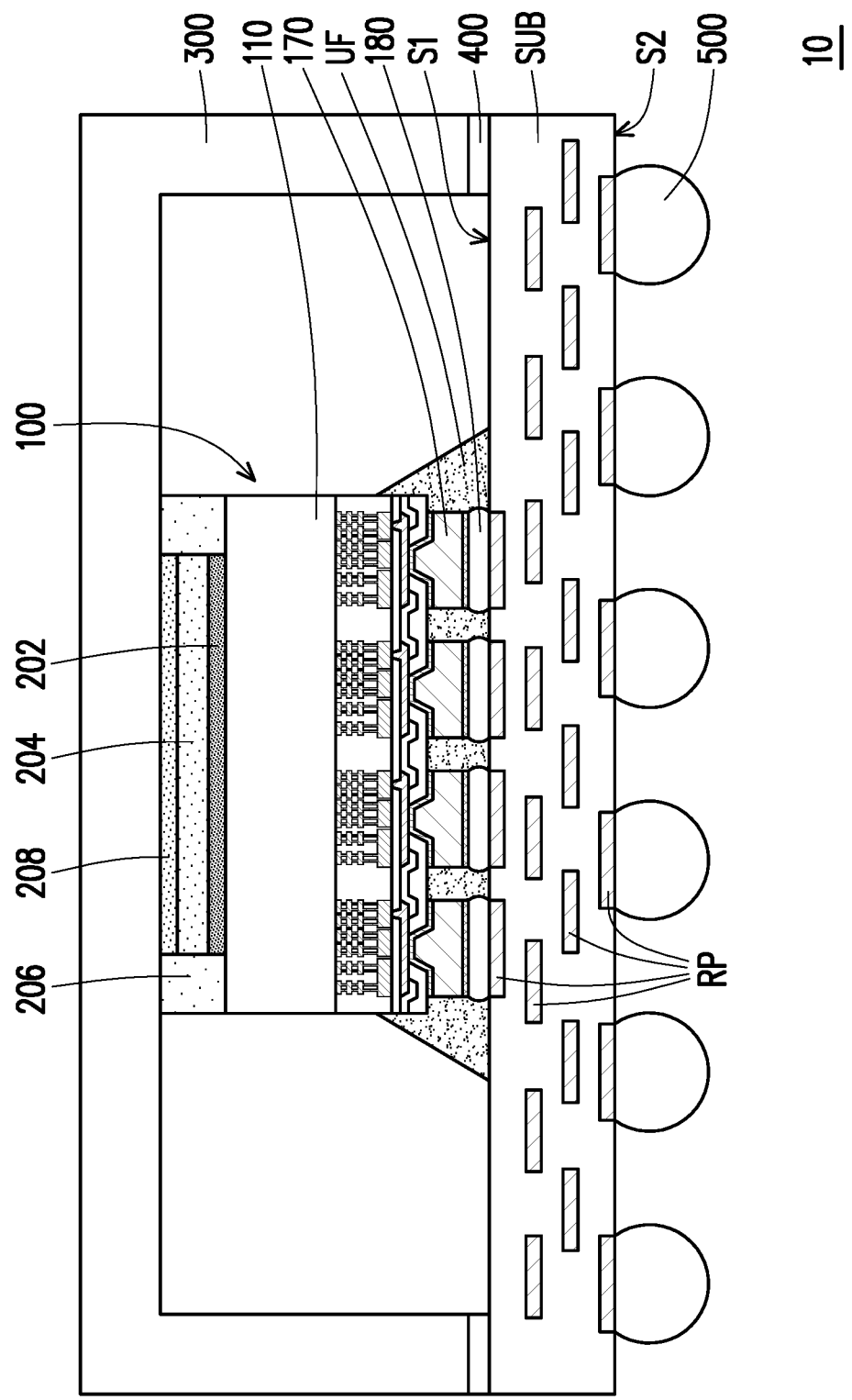

Referring to FIG. 2F, a plurality of conductive terminals 500 is formed on the second surface S2 of the substrate SUB to obtain the semiconductor package 10. In some embodiments, the conductive terminals 500 are solder balls, ball grid array (BGA) balls, or the like. In some embodiments, the conductive terminals 500 are made of a conductive material with low resistivity, such as Sn, Pb, Ag, Cu, Ni, Bi, or an alloy thereof. In some embodiments, the conductive terminals 500 are in physical contact with the routing patterns RP exposed at the second surface S2 of the substrate SUB.

Figure 4:
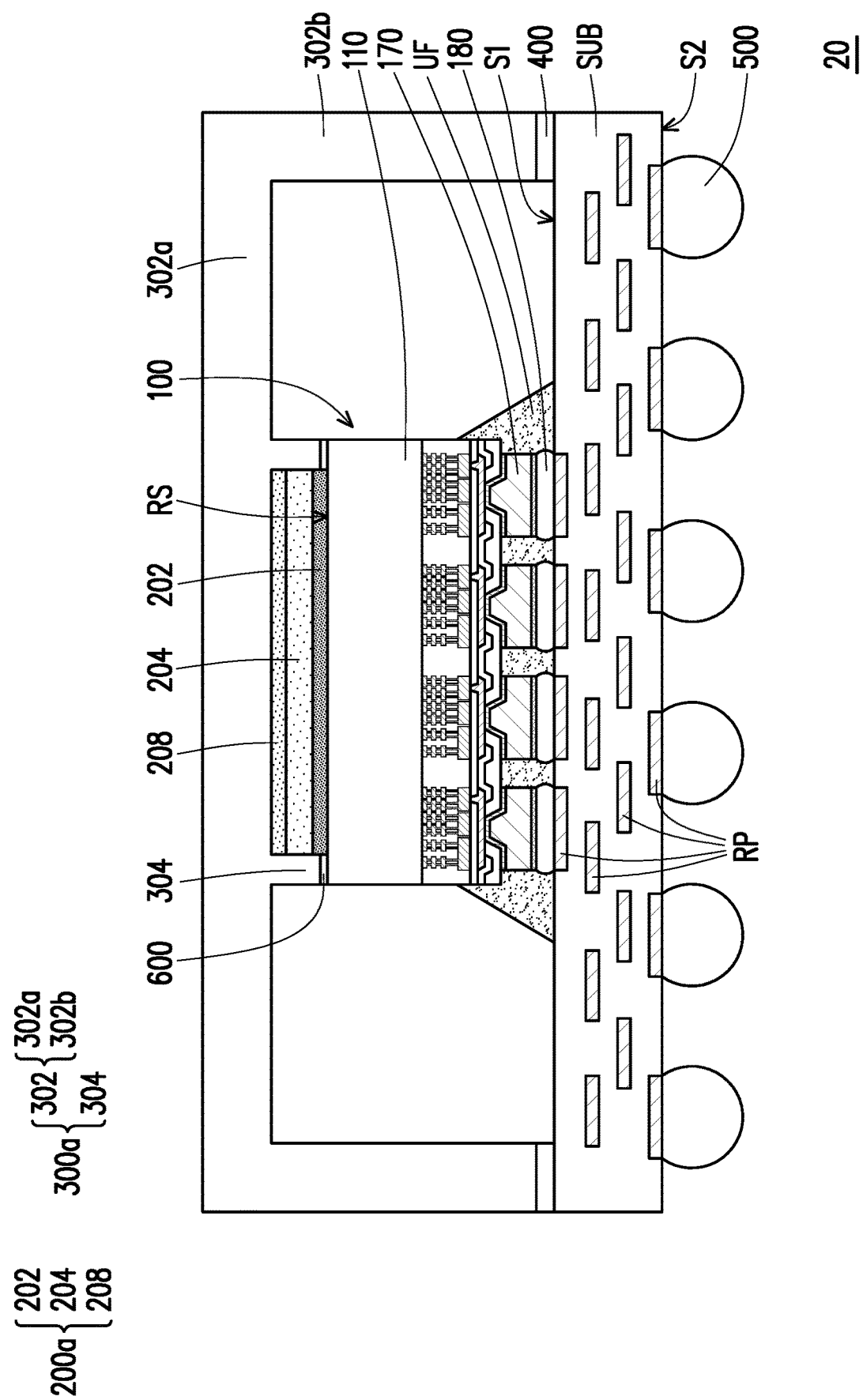
FIG. 4 is a schematic cross-sectional view illustrating a semiconductor package in accordance with some alternative embodiments of the disclosure.

FIG. 4 is a schematic cross-sectional view illustrating a semiconductor package 20 in accordance with some alternative embodiments of the disclosure. Referring to FIG. 4, the semiconductor package 20 in FIG. 4 is similar to the semiconductor package 10 in FIG. 2F, so similar elements are denoted by the same reference numeral and the detailed descriptions thereof are omitted herein. However, the adhesive layer 200 and the lid 300 in the semiconductor package 10 of FIG. 2F are respectively being replaced by an adhesive layer 200a and a lid 300a in the semiconductor package 20 of FIG. 4. In some embodiments, the adhesive layer 200a in FIG. 4 is similar to the adhesive layer 200 in FIG. 2F except the polymeric TIM layer 206 is omitted.

In some embodiments, the lid 300a has a body portion 302 and a protruding portion 304 connected to the body portion 302. In some embodiments, the body portion 302 is divided into a cover portion 302a and a leg portion 302b. As illustrated in FIG. 4, an extending direction of the cover portion 302a is perpendicular to an extending direction of the leg portion 302b. In some embodiments, the cover portion 302a is connected to the leg portion 302b. For example, the cover portion 302a and the leg portion 302b are integrally formed. In some embodiments, the leg portion 302b is attached to the substrate SUB through the adhesive layer 400. On the other hand, the cover portion 302a is attached to the semiconductor die 100 through the adhesive layer 200a. In other words, the adhesive layer 200a is sandwiched between the cover portion 302a of the body portion 302 of the lid 300a and the semiconductor die 100.

In some embodiments, the protruding portion 304 is connected to the cover portion 302a of the body portion 302. For example, the protruding portion 304 protrudes out from a surface of the cover portion 302a. As illustrated in FIG. 4, the protruding portion 304 is shorter than the leg portion 302b of the body portion 302. In some embodiments, the protruding portion 304 and the body portion 302 are integrally formed. For example, a material of the protruding portion 304 is the same as a material of the body portion 302. However, the disclosure is not limited thereto. In some alternative embodiments, the protruding portion 304 may be installed on the body portion 302. For example, the material of the protruding portion 304 may be different from the material of the body portion 302. In some embodiments, a material of the body portion 302 and a material of the protruding portion 304 respectively includes copper, stainless steel, solder, gold, nickel, molybdenum, NiFe, NiFeCr, an alloy thereof, a combination thereof, or any other suitable conductive material. In some embodiments, a Young's modulus of the protruding portion 304 ranges from about 15 GPa to about 150 GPa.

As illustrated in FIG. 4, the protruding portion 304 of the lid 300a is attached to the semiconductor substrate 110 of the semiconductor die 100 through an adhesive layer 600. In some embodiments, the adhesive layer 200a is formed on the rear surface RS of the semiconductor substrate 110 of the semiconductor die 100. Meanwhile, the adhesive layer 200a exposes corners and/or edges of the rear surface RS of the semiconductor substrate 110 from the top view. In some embodiments, the protruding portion 304 of the lid 300a and the adhesive layer 600 attached thereto are formed on the exposed portion of the rear surface RS of the semiconductor substrate 110. That is, the protruding portion 304 of the lid 300a and the adhesive layer 600 are formed adjacent to the adhesive layer 200a to cover the exposed portion of the rear surface RS of the semiconductor substrate 110. As such, the protruding portion 304 of the lid 300a and the adhesive layer 600 are formed on corners and/or edges of the rear surface RS of the semiconductor substrate 110. Various configurations of the protruding portion 304 with respect to the adhesive layer 200a will be described below in conjunction with FIG. 4 and FIG. 5A to FIG. 5C.

Figure 5A:
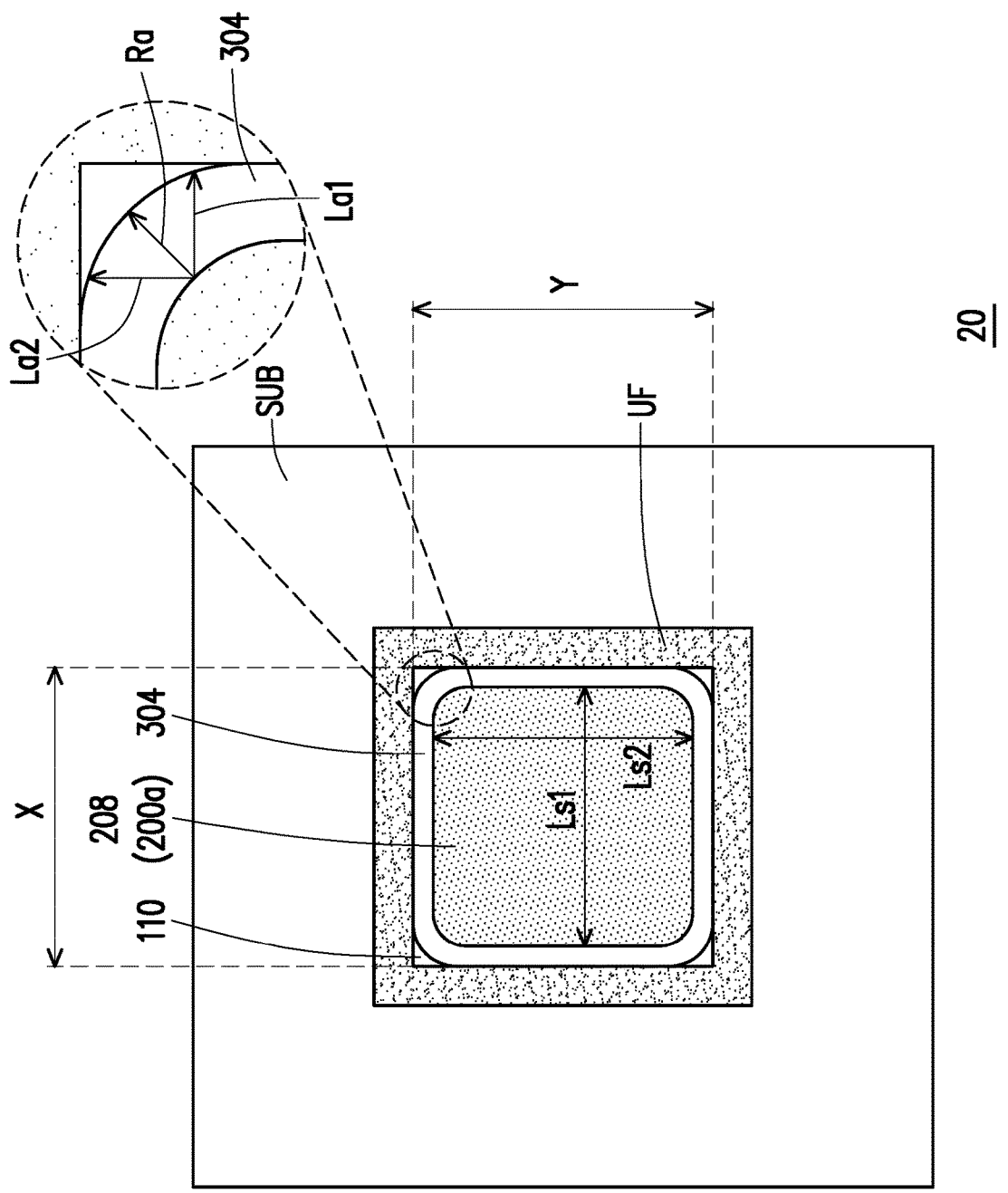
FIG. 5A is a schematic top view of the semiconductor package in FIG. 4.

FIG. 5A is a schematic top view of the semiconductor package 20 in FIG. 4. For simplicity, the body portion 302 is omitted in the top view of FIG. 5A. Referring to FIG. 4 and FIG. 5A, the protruding portion 304 is a continuous ring pattern from the top view. For example, the protruding portion 304 extends along edges of the semiconductor substrate 110 to form the continuous ring pattern. In some embodiments, the protruding portion 304 surrounds the adhesive layer 200a. For example, the adhesive layer 200a fills the region enclosed by the protruding portion 304. In some embodiments, the protruding portion 304 is physically in contact with sidewalls of the adhesive layer 200a. As illustrated in FIG. 5A, the corners of the protruding portion 304 are rounded. For example, the protruding portion 304 may expose four corners of the semiconductor substrate 110. In general, during the manufacturing processes (for example, the thermal processes) of the semiconductor package 20, mechanical strain/stress would generate nearby corners of the semiconductor substrate 110 of the semiconductor die 100 to cause delamination of the adhesive layer 200a. However, as illustrated in FIG. 5A, since the corners of the semiconductor substrate 110 of the semiconductor die 100 are being exposed and the protruding portion 304 of the lid 300a partitions the adhesive layer 200a from the corners of the semiconductor substrate 110 of the semiconductor die 100, the protruding portion 304 may serve as a stop layer to reduce the mechanical strain/stress exerted on the adhesive layer 200a. For example, with the presence of the protruding portion 304, the mechanical strain/stress exerted on the adhesive layer 200a may be reduced by at least 93% as compared to a scenario where the protruding portion 304 is absent. As such, the problem of delamination of the adhesive layer 200a may be sufficiently alleviated and the performance of the semiconductor package 20 may be sufficiently enhanced.

As illustrated in FIG. 5A, the protruding portion 304 of the lid 300a has a first width La1 along a first direction D1 and a second width La1 along a second direction D2 perpendicular to the first direction D1. In addition, the protruding portion 304 of the lid 300a also has a third width Ra along a radial direction D3 which forms a 45° angle with both the first direction D1 and the second direction D2. In some embodiments, a ratio of the third width Ra to the first width La1 ranges from about 0.5 to about 1.8. On the other hand, a ratio of the third width Ra to the second width La2 ranges from about 0.5 to about 1.8. In some embodiments, the semiconductor substrate 110 has a first width X (i.e. the first width of the semiconductor die 100) along the first direction D1 and a second width Y (i.e. the second width of the semiconductor die 100) along the second direction D2. Meanwhile, the adhesive layer 200a has a first width Ls1 along the first direction D1 and a second width Ls2 along the second direction D2. In some embodiments, a ratio of the first width Ls1 of the adhesive layer 200a to the first width X of the semiconductor die 100 ranges from about 0.5 to about 0.9. On the other hand, a ratio of the second width Ls2 of the adhesive layer 200a to the second width Y of the semiconductor die 100 ranges from about 0.5 to about 0.9. In some embodiments, a ratio of the first width La1 of the protruding portion 304 to the first width X of the semiconductor die 100 ranges from about 0.01 to about 0.1. On the other hand, a ratio of the second width La2 of the protruding portion 304 to the second width Y of the semiconductor die 100 ranges from about 0.01 to about 0.1. In some embodiments, a ratio of the first width Ls1 of the adhesive layer 200a to the first width La1 of the protruding portion 304 ranges from about 9 to about 50. On the other hand, a ratio of the second width Ls2 of the adhesive layer 200a to the second width La2 of the protruding portion 304 ranges from about 9 to about 50. In some embodiments, the adhesive layer 200a occupies about 50% to about 90% of the total area of the rear surface RS of the semiconductor substrate 110. On the other hand, the protruding portion 304 occupies about 10% to about 50% of the total area of the rear surface RS of the semiconductor substrate 110. In some embodiments, by allowing the geometry and the dimension of the protruding portion 304 to fall within the foregoing ranges, the thermal conductivity of the adhesive layer 200a may be sufficiently maintained. As such, the problem of delamination of the adhesive layer 200a may be resolved without jeopardizing the thermal performance of the semiconductor package 20.

It should be noted that the configuration shown in FIG. 5A is merely an exemplary arrangement of the protruding portion 304 of the lid 300a and the adhesive layer 200a. In some alternative embodiments, the protruding portion 304 of the lid 300a may adopt different arrangements. These arrangements will be described below in conjunction with FIGS. 5B and 5C.

Figure 5B:
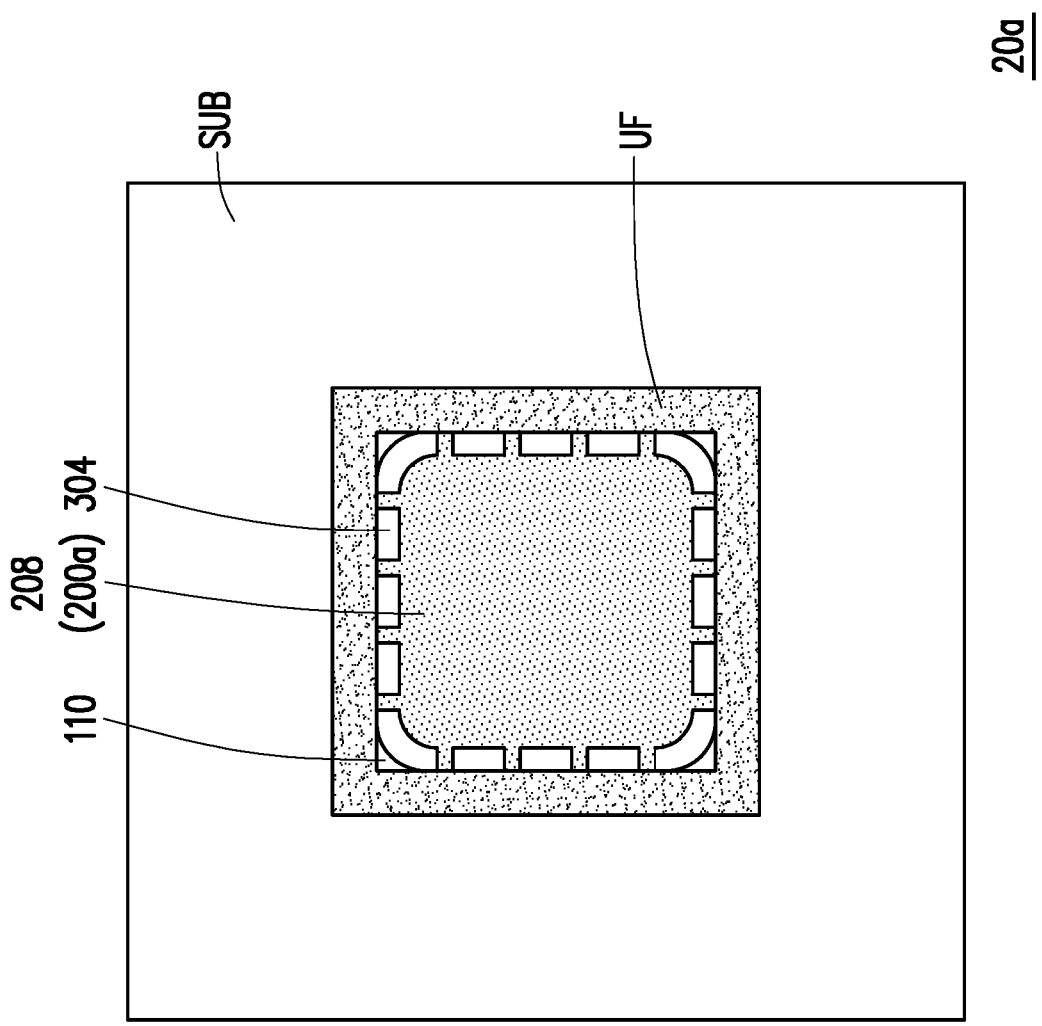
FIG. 5B and FIG. 5C are schematic top views of semiconductor packages in accordance with some alternative embodiments of the disclosure.

FIG. 5B is a schematic top views of the semiconductor package 20a in accordance with some alternative embodiments of the disclosure. Referring to FIG. 5B, the semiconductor package 20a in FIG. 5B is similar to the semiconductor package 20 in FIG. 5A, so similar elements are denoted by the same reference numeral and the detailed descriptions thereof are omitted herein. The difference between the semiconductor package 20a in FIG. 5B and the semiconductor package 20 in FIG. 5A lies in that the protruding portion 304 of the lid 300a in FIG. 5B is a discontinuous ring pattern from the top view. That is, the adhesive layer 200a covers a portion of the edges of the rear surface RS of the semiconductor substrate 110. In general, during the manufacturing processes (for example, the thermal processes) of the semiconductor package 20a, mechanical strain/stress would generate nearby corners of the semiconductor substrate 110 of the semiconductor die 100 to cause delamination of the adhesive layer 200a. However, as illustrated in FIG. 5B, since the corners of the semiconductor substrate 110 of the semiconductor die 100 are being exposed and the protruding portion 304 of the lid 300a partitions the adhesive layer 200a from the corners of the semiconductor substrate 110 of the semiconductor die 100, the protruding portion 304 may serve as a stop layer to reduce the mechanical strain/stress exerted on the adhesive layer 200a. For example, with the presence of the protruding portion 304, the mechanical strain/stress exerted on the adhesive layer 200a may be reduced by at least 93% as compared to a scenario where the protruding portion 304 is absent. As such, the problem of delamination of the adhesive layer 200a may be sufficiently alleviated and the performance of the semiconductor package 20a may be sufficiently enhanced.

Figure 5C:
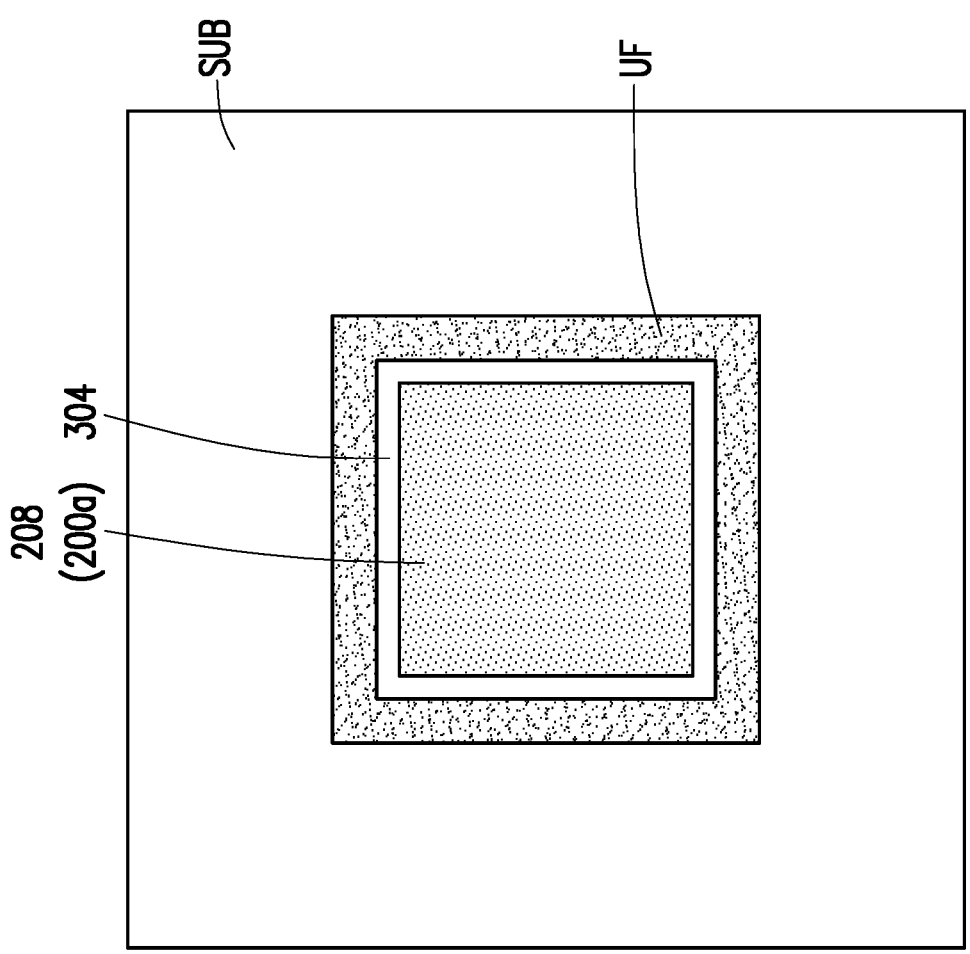

FIG. 5C is a schematic top views of the semiconductor package 20b in accordance with some alternative embodiments of the disclosure. Referring to FIG. 5C, the semiconductor package 20b in FIG. 5C is similar to the semiconductor package 20 in FIG. 5A, so similar elements are denoted by the same reference numeral and the detailed descriptions thereof are omitted herein. The difference between the semiconductor package 20b in FIG. 5C and the semiconductor package 20 in FIG. 5A lies in that the protruding portion 304 of the lid 300a in FIG. 5C has sharp corners from the top view. That is, the protruding portion 304 follows the profile of the underlying semiconductor substrate 100 and forms a quadrilateral ring pattern. For example, the protruding portion 304 is located on the corners and the edges of the rear surface RS of the semiconductor substrate 100. In general, during the manufacturing processes (for example, the thermal processes) of the semiconductor package 20b, mechanical strain/stress would generate nearby corners of the semiconductor substrate 110 of the semiconductor die 100 to cause delamination of the adhesive layer 200a. However, as illustrated in FIG. 5C, since the protruding portion 304 occupies the regions directly above the corners of the semiconductor die 100, the protruding portion 304 may serve as a stop layer to reduce the mechanical strain/stress exerted on the adhesive layer 200a. For example, with the presence of the protruding portion 304, the mechanical strain/stress exerted on the adhesive layer 200a may be reduced by at least 93% as compared to a scenario where the protruding portion 304 is absent. As such, the problem of delamination of the adhesive layer 200a may be sufficiently alleviated and the performance of the semiconductor package 20b may be sufficiently enhanced.

Figure 6:
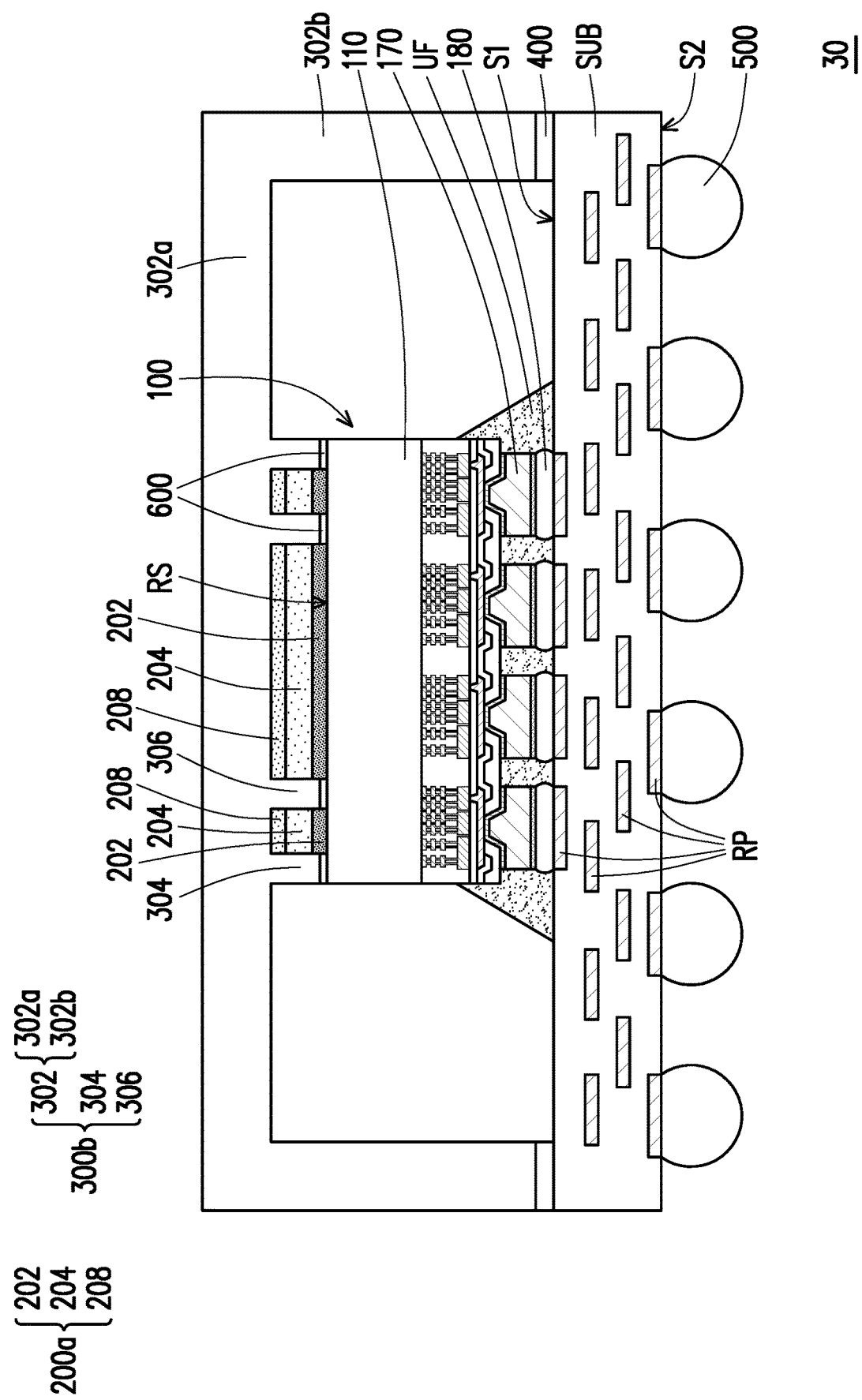
FIG. 6 a schematic cross-sectional view illustrating a semiconductor package in accordance with some alternative embodiments of the disclosure.
Figure 7A:
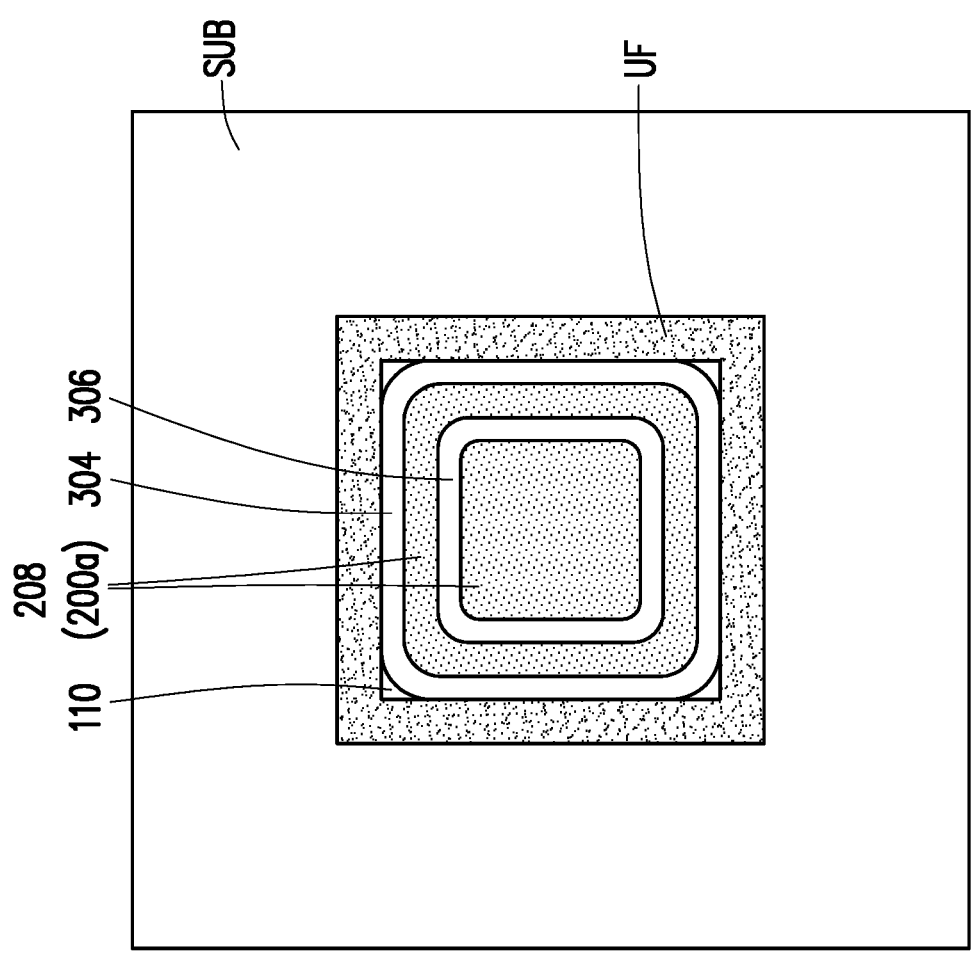
FIG. 7A is a schematic top view of the semiconductor package in FIG. 6.

FIG. 6 a schematic cross-sectional view illustrating a semiconductor package 30 in accordance with some alternative embodiments of the disclosure. FIG. 7A is a schematic top view of the semiconductor package 30 in FIG. 6. For simplicity, the body portion 302 is omitted in the top view of FIG. 7A. Referring to FIG. 6 and FIG. 7A, the semiconductor package 30 in FIG. 6 and FIG. 7A is similar to the semiconductor package 20 in FIG. 4, so similar elements are denoted by the same reference numeral and the detailed descriptions thereof are omitted herein. However, the lid 300a in the semiconductor package 20 of FIG. 4 is being replaced by a lid 300b in the semiconductor package 30 of FIG. 6. The lid 300b in FIG. 6 is similar to the lid 300a in FIG. 4, except the lid 300b in FIG. 6 further includes a protruding portion 306. In other words, the lid 300b includes the body portion 302, the protruding portion 304, and the protruding portion 306. In some embodiments, the protruding portion 306 is connected to the cover portion 302a of the body portion 302. For example, the protruding portion 306 protrudes out from a surface of the cover portion 302a. In some embodiments, the protruding portion 304 and the protruding portion 306 are shorter than the leg portion 302b of the body portion 302. In some embodiments, a height of the protruding portion 304 is substantially equal to a height of the protruding portion 306, as illustrated in FIG. 6. In some embodiments, the protruding portion 306 and the body portion 302 are integrally formed. For example, a material of the protruding portion 306 is the same as a material of the body portion 302. However, the disclosure is not limited thereto. In some alternative embodiments, the protruding portion 306 may be installed on the body portion 302. For example, the material of the protruding portion 306 may be different from the material of the body portion 302. In some embodiments, a material of the body portion 302 and a material of the protruding portion 306 respectively includes copper, stainless steel, solder, gold, nickel, molybdenum, NiFe, NiFeCr, an alloy thereof, a combination thereof, or any other suitable conductive material. In some embodiments, a Young's modulus of the protruding portion 306 ranges from about 15 GPa to about 150 GPa.

As illustrated in FIG. 6, the protruding portion 304 and the protruding portion 306 of the lid 300b are attached to the semiconductor substrate 110 of the semiconductor die 100 through an adhesive layer 600. Referring to FIG. 6 and FIG. 7A, the protruding portion 306 is spatially separated from the protruding portion 304. For example, the protruding portion 306 is separated from the protruding portion 304 by the adhesive layer 200a disposed therebetween. In some embodiments, the protruding portion 304 and the protruding portion 306 are continuous ring patterns from the top view. That is, the protruding portion 304 and the protruding portion 306 are concentric ring patterns. In some embodiments, the protruding portion 304 surrounds the protruding portion 306. For example, the protruding portion 306 is located within a space enclosed by the protruding portion 304. In some embodiments, the protruding portion 306 surrounds a portion of the adhesive layer 200a while being surrounded by another portion of the adhesive layer 200a. For example, the protruding portion 306 is embedded in the adhesive layer 200a. In some embodiments, the protruding portion 304 and the protruding portion 306 are physically in contact with sidewalls of the adhesive layer 200a. As illustrated in FIG. 7A, the corners of the protruding portion 304 and the corners of the protruding portion 306 are rounded.

In general, during the manufacturing processes (for example, the thermal processes) of the semiconductor package 30, mechanical strain/stress would generate nearby corners of the semiconductor substrate 110 of the semiconductor die 100 to cause delamination of the adhesive layer 200a. However, as illustrated in FIG. 7A, since the corners of the semiconductor substrate 110 of the semiconductor die 100 are being exposed and the protruding portion 304 and the protruding portion 306 of the lid 300b partition the adhesive layer 200a from the corners of the semiconductor substrate 110 of the semiconductor die 100, the protruding portion 304 and the protruding portion 306 may serve as stop layers to reduce the mechanical strain/stress exerted on the adhesive layer 200a. For example, with the presence of the protruding portion 304 and the protruding portion 306, the mechanical strain/stress exerted on the adhesive layer 200a may be reduced by at least 93% as compared to a scenario where the protruding portion 304 and the protruding portion 306 are absent. As such, the problem of delamination of the adhesive layer 200a may be sufficiently alleviated and the performance of the semiconductor package 30 may be sufficiently enhanced. In some embodiments, the geometry and the dimension (i.e. the width) of the protruding portion 306 may be similar to that of the protruding portion 304, so the detailed descriptions thereof are omitted herein.

It should be noted that the configuration shown in FIG. 7A is merely an exemplary arrangement of the protruding portion 304 and the protruding portion 306 of the lid 300b and the adhesive layer 200a. In some alternative embodiments, the protruding portion 304 of the lid 300b may adopt different arrangement. The different arrangement will be described below in conjunction with FIG. 7B.

Figure 7B:
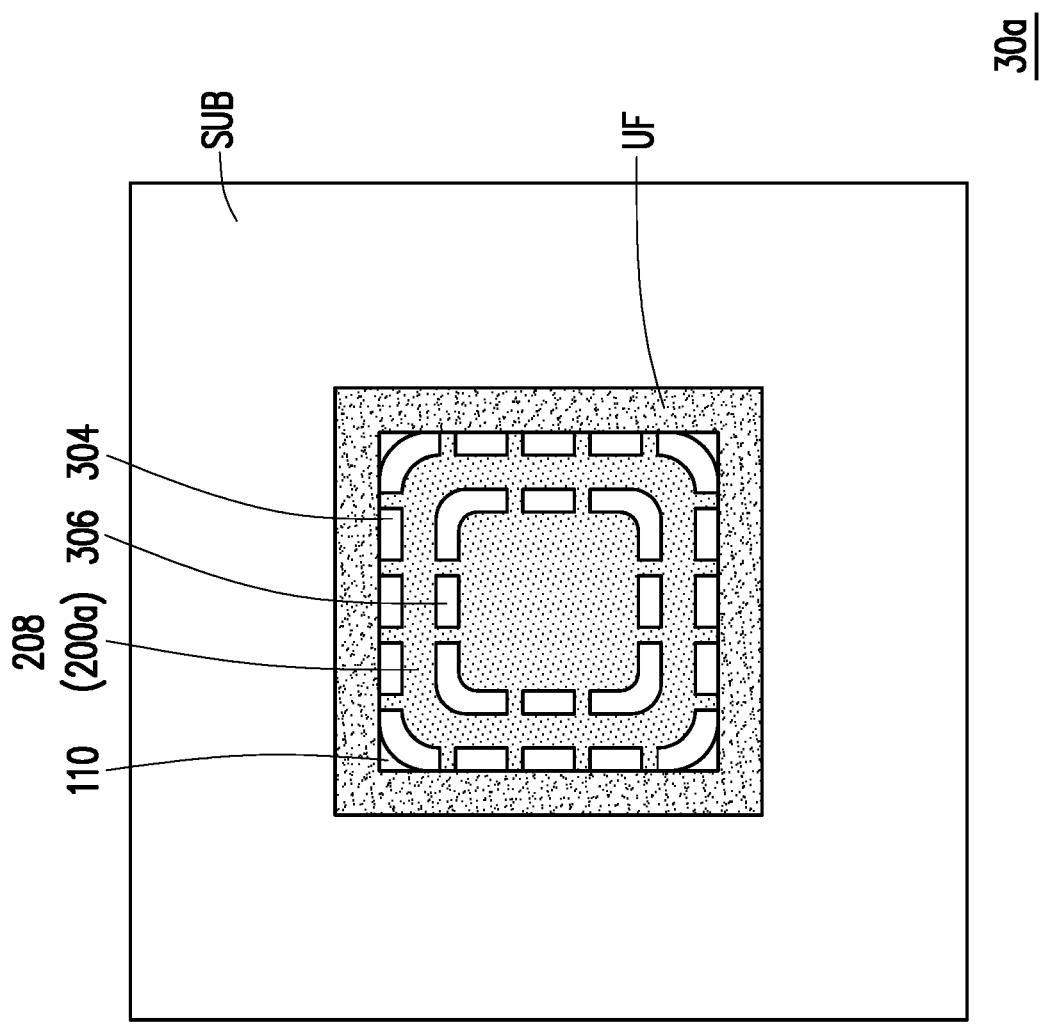
FIG. 7B is a schematic top view of a semiconductor package in accordance with some alternative embodiments of the disclosure.

FIG. 7B is a schematic top view of the semiconductor package 30a in accordance with some alternative embodiments of the disclosure. Referring to FIG. 7B, the semiconductor package 30a in FIG. 7B is similar to the semiconductor package 30 in FIG. 7A, so similar elements are denoted by the same reference numeral and the detailed descriptions thereof are omitted herein. The difference between the semiconductor package 30a in FIG. 7B and the semiconductor package 30 in FIG. 7A lies in that the protruding portion 304 and the protruding portion 306 of the lid 300b in FIG. 7B are both discontinuous ring patterns from the top view. That is, the adhesive layer 200a covers a portion of the edges of the rear surface RS of the semiconductor substrate 110. In some embodiments, the adhesive layer 200a located inside of the enclosure of the protruding portion 306 is communicated with the adhesive layer 200a located outside of the enclosure to the protruding portion 306. In general, during the manufacturing processes (for example, the thermal processes) of the semiconductor package 30a, mechanical strain/stress would generate nearby corners of the semiconductor substrate 110 of the semiconductor die 100 to cause delamination of the adhesive layer 200a. However, as illustrated in FIG. 7B, since the corners of the semiconductor substrate 110 of the semiconductor die 100 are being exposed and the protruding portion 304 and the protruding portion 306 of the lid 300b partition the adhesive layer 200a from the corners of the semiconductor substrate 110 of the semiconductor die 100, the protruding portion 304 and the protruding portion 306 may serve as stop layers to reduce the mechanical strain/stress exerted on the adhesive layer 200a. For example, with the presence of the protruding portion 304 and the protruding portion 306, the mechanical strain/stress exerted on the adhesive layer 200a may be reduced by at least 93% as compared to a scenario where the protruding portion 304 and the protruding portion 306 are absent. As such, the problem of delamination of the adhesive layer 200a may be sufficiently alleviated and the performance of the semiconductor package 30a may be sufficiently enhanced.

Figure 8:
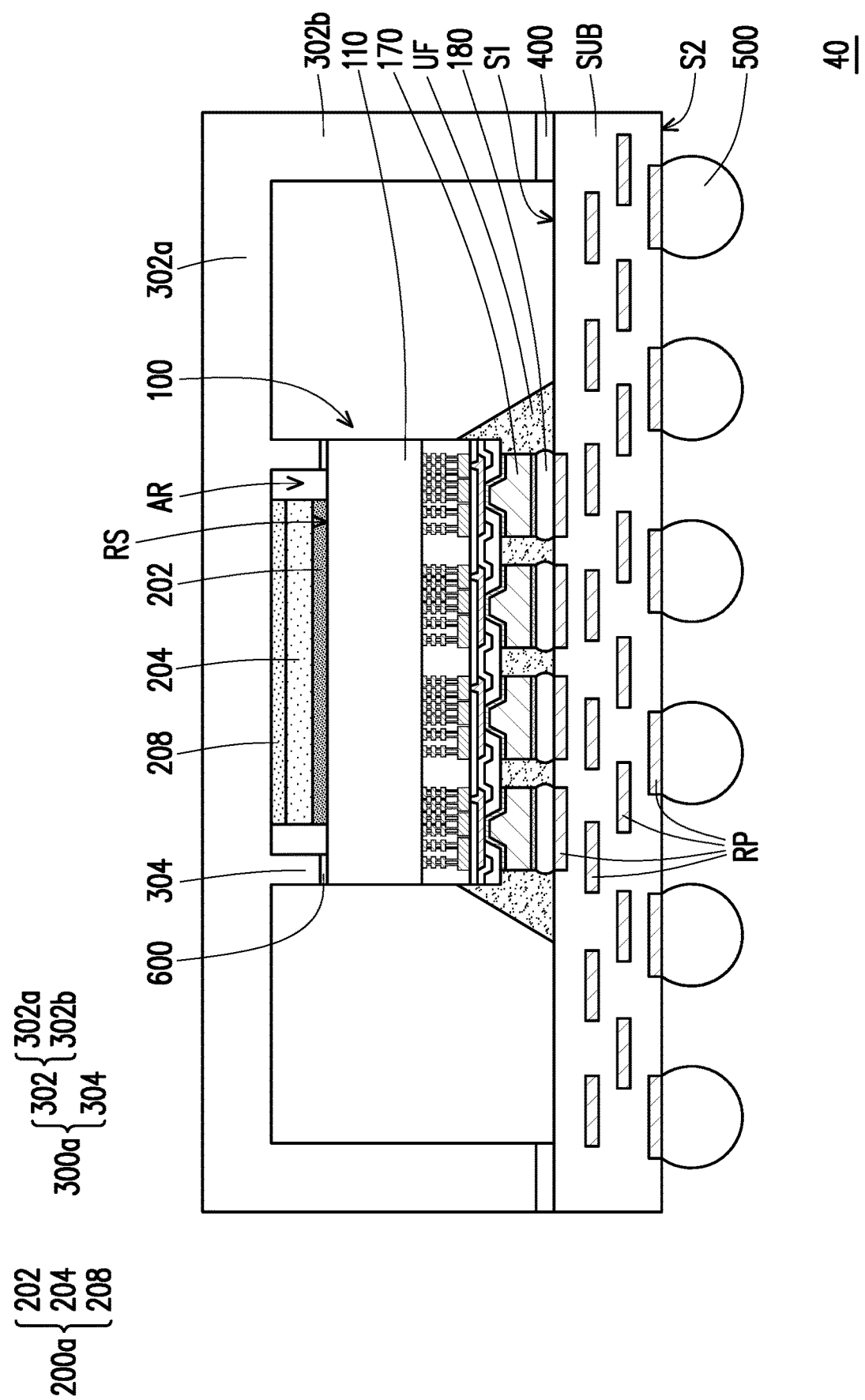
FIG. 8 a schematic cross-sectional view illustrating a semiconductor package in accordance with some alternative embodiments of the disclosure.

FIG. 8 a schematic cross-sectional view illustrating a semiconductor package 40 in accordance with some alternative embodiments of the disclosure. Referring to FIG. 8, the semiconductor package 40 in FIG. 8 is similar to the semiconductor package 20 in FIG. 4, so similar elements are denoted by the same reference numeral and the detailed descriptions thereof are omitted herein. However, in the semiconductor package 40 of FIG. 8, the protruding portion 304 of the lid 300a is spatially separated from the adhesive layer 200a. In other words, an air gap AR is formed in a region enclosed by the adhesive layer 200a, the cover portion 302a, the protruding portion 304, and the semiconductor substrate 110.

In general, during the manufacturing processes (for example, the thermal processes) of the semiconductor package 40, mechanical strain/stress would generate nearby corners of the semiconductor substrate 110 of the semiconductor die 100 to cause delamination of the adhesive layer 200a. However, since the corners of the semiconductor substrate 110 of the semiconductor die 100 are being exposed and the protruding portion 304 of the lid 300a partitions the adhesive layer 200a from the corners of the semiconductor substrate 110 of the semiconductor die 100, the protruding portion 304 may serve as a stop layer to reduce the mechanical strain/stress exerted on the adhesive layer 200a. For example, with the presence of the protruding portion 304, the mechanical strain/stress exerted on the adhesive layer 200a may be reduced by at least 93% as compared to a scenario where the protruding portion 304 is absent. As such, the problem of delamination of the adhesive layer 200a may be sufficiently alleviated and the performance of the semiconductor package 40 may be sufficiently enhanced.

Figure 9:
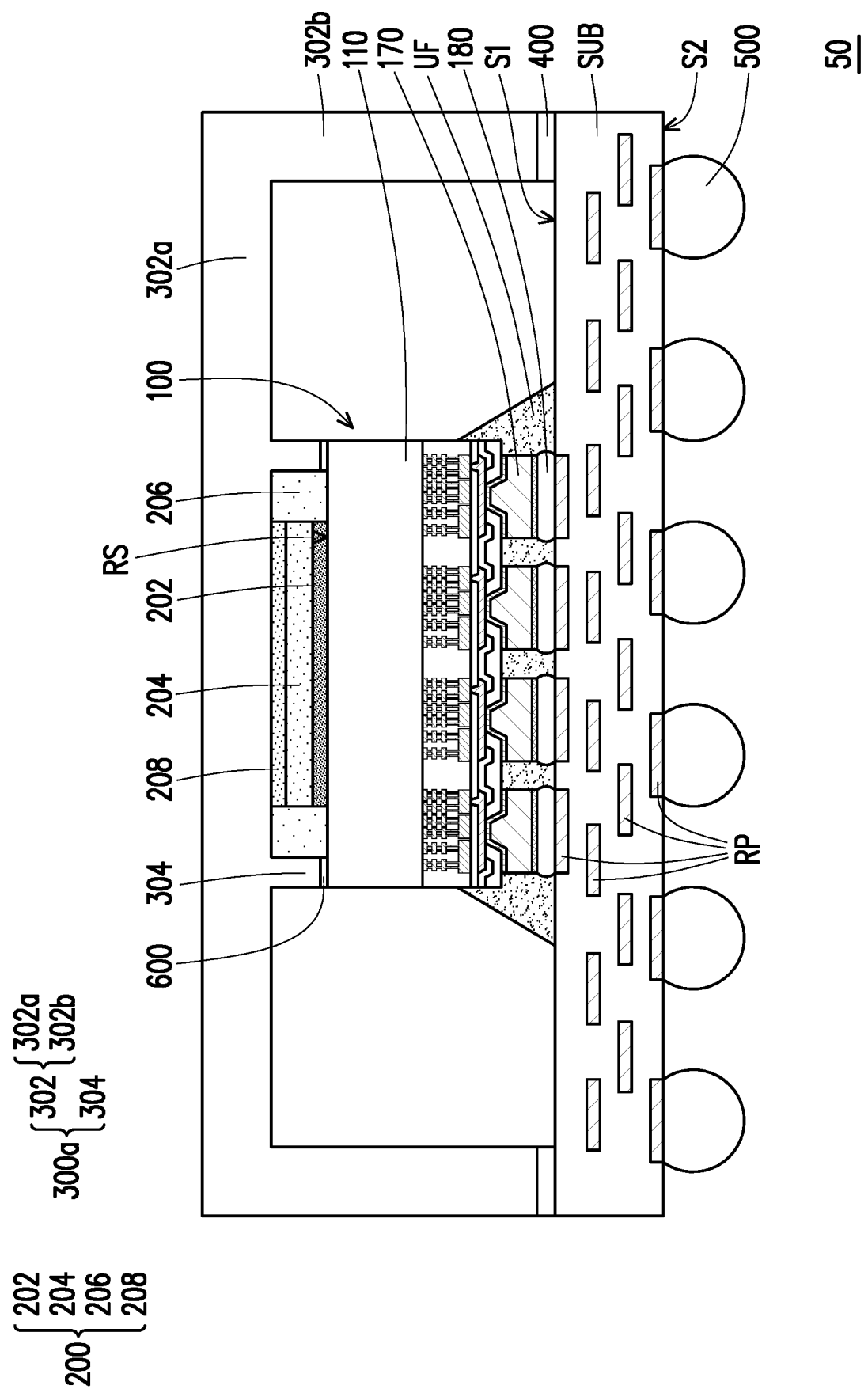
FIG. 9 a schematic cross-sectional view illustrating a semiconductor package in accordance with some alternative embodiments of the disclosure.

FIG. 9 a schematic cross-sectional view illustrating a semiconductor package 50 in accordance with some alternative embodiments of the disclosure. Referring to FIG. 9, the semiconductor package 50 in FIG. 9 is similar to the semiconductor package 20 in FIG. 4, so similar elements are denoted by the same reference numeral and the detailed descriptions thereof are omitted herein. However, the adhesive layer 200a in the semiconductor package 20 of FIG. 4 is being replaced by an adhesive layer 200 in the semiconductor package 50 of FIG. 9. The adhesive layer 200 in FIG. 9 is similar to the adhesive layer 200 in FIG. 2F, so the detailed description thereof is omitted herein. In some embodiments, the adhesive layer 200 includes the first metal layer 202, the metallic TIM layer 204, the polymeric TIM layer 206, and the second metal layer 208. As illustrated in FIG. 9, the protruding portion 304 of the lid 300a surrounds the adhesive layer 200. For example, the protruding portion 304 of the lid 300a is in physical contact with and surrounds the polymeric TIM layer 206.

In general, during the manufacturing processes (for example, the thermal processes) of the semiconductor package 50, mechanical strain/stress would generate nearby corners of the semiconductor substrate 110 of the semiconductor die 100 to cause delamination of the adhesive layer 200. However, since the corners of the semiconductor substrate 110 of the semiconductor die 100 are being exposed and the protruding portion 304 of the lid 300a and the polymeric TIM layer 206 partition the metallic TIM layer 204 from the corners of the semiconductor substrate 110 of the semiconductor die 100, the protruding portion 304 and the polymeric TIM layer 206 may serve as stop layers or buffer layers to reduce the mechanical strain/stress exerted on the adhesive layer 200. For example, with the presence of the protruding portion 304 and the polymeric TIM layer 206, the mechanical strain/stress exerted on the adhesive layer 200 may be reduced by at least 83% as compared to a scenario where the protruding portion 304 and the polymeric TIM layer 206 are absent. As such, the problem of delamination of the adhesive layer 200 may be sufficiently alleviated and the performance of the semiconductor package 50 may be sufficiently enhanced.

In accordance with some embodiments of the disclosure, a semiconductor package includes a substrate, a semiconductor die, a lid, and an adhesive layer. The semiconductor die is attached to the substrate. The lid is over the semiconductor die and the substrate. The adhesive layer is sandwiched between the lid and the semiconductor die. The adhesive layer includes a metallic thermal interface material (TIM) layer and a polymeric TIM layer adjacent to the metallic TIM layer. The polymeric TIM layer is located on corners of the semiconductor die from a top view.

In accordance with some alternative embodiments of the disclosure, a semiconductor package includes a substrate, a semiconductor die, a lid, and an adhesive layer. The semiconductor die is attached to the substrate. The lid is over the semiconductor die and the substrate. The lid includes a body portion and a first protruding portion connected to the body portion. The first protruding portion is attached to the semiconductor die. The adhesive layer is sandwiched between the body portion of the lid and the semiconductor die. The first protruding portion surrounds the adhesive layer.

In accordance with some embodiments of the disclosure, a manufacturing method of a semiconductor package includes at least the following steps. A substrate is provided. A semiconductor die is bonded to the substrate. The semiconductor die includes a semiconductor substrate. A gallium layer is dispensed on the semiconductor die. A metallic thermal interface material (TIM) layer is formed on the gallium layer. The gallium layer and the metallic TIM layer expose a portion of the semiconductor substrate of the semiconductor die. A polymeric TIM layer is formed on at least part of the exposed portion of the semiconductor substrate. A lid is attached to the polymeric TIM layer and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate;
   a semiconductor die attached to the substrate;
   a lid over the semiconductor die and the substrate, wherein the lid comprises a body portion and a first protruding portion connected to the body portion, the first protruding portion is attached to the semiconductor die, an outer sidewall of the first protruding portion is aligned with a sidewall of the semiconductor die, and a material of the first protruding portion is the same as a material of the body portion; and
   an adhesive layer sandwiched between the body portion of the lid and the semiconductor die, wherein the first protruding portion surrounds the adhesive layer.

2. The semiconductor package of claim 1, wherein a Young's modulus of the first protruding portion ranges from about 15 GPa to about 150 GPa.

3. The semiconductor package of claim 1, wherein a ratio of a width of the adhesive layer to a width of the first protruding portion ranges from about 9 to about 50.

4. The semiconductor package of claim 1, wherein the first protruding portion is a continuous ring pattern from a top view.

5. The semiconductor package of claim 1, wherein the first protruding portion is a discontinuous ring pattern from a top view.

6. The semiconductor package of claim 1, wherein the lid further comprises a second protruding portion connected to the body portion, the second protruding portion is attached to the semiconductor die, the second protruding portion is spatially separated from the first protruding portion, and the first protruding portion laterally surrounds the adhesive layer.

7. The semiconductor package of claim 6, wherein the first protruding portion surrounds the second protruding portion.

8. The semiconductor package of claim 1, wherein the first protruding portion is spatially separated from the adhesive layer.

9. A manufacturing method of a semiconductor package, comprising:
provide a substrate;
bonding a semiconductor die to the substrate, wherein the semiconductor die comprises a semiconductor substrate;
forming an adhesive layer, comprising:
dispensing a gallium layer on the semiconductor die; and
forming a metallic thermal interface material (TIM) layer on the gallium layer, wherein the gallium layer and the metallic TIM layer expose a portion of the semiconductor substrate of the semiconductor die; and
attaching a lid to the semiconductor die and the substrate, wherein the lid comprises a body portion and a protruding portion connected to the body portion, the protruding portion is attached to the semiconductor die to surround the adhesive layer such that the adhesive layer is sandwiched between the body portion of the lid and the semiconductor die, an outer sidewall of the protruding portion is aligned with a sidewall of the semiconductor die, and a material of the protruding portion is the same as a material of the body portion.

10. The method of claim 9, wherein forming the adhesive layer further comprises:
attaching a gold layer to the metallic TIM layer.

11. The method of claim 9, wherein
the protruding portion of the lid is attached to the exposed portion of the semiconductor substrate.

12. The method of claim 9, wherein the exposed portion of the semiconductor substrate is corners of the semiconductor substrate from a top view.

13. A semiconductor package, comprising:
a substrate;
a semiconductor die attached to the substrate;
a lid over the semiconductor die and the substrate, wherein the lid comprises a body portion and a first protruding portion connected to the body portion, the first protruding portion is attached to the semiconductor die, an outer sidewall of the first protruding portion is aligned with a sidewall of the semiconductor die, and a material of the first protruding portion is the same as a material of the body portion; and
an adhesive layer sandwiched between the body portion of the lid and the semiconductor die, wherein the adhesive layer comprises a first metal layer and a metallic thermal interface material (TIM) layer disposed on the first metal layer, and the first protruding portion surrounds the adhesive layer.

14. The semiconductor package of claim 13, wherein the adhesive layer further comprises a second metal layer disposed on the metallic TIM layer, and a material of the first metal layer is different from a material of the second metal layer.

15. The semiconductor package of claim 14, wherein the first metal layer comprises gallium and the second metal layer comprises gold.

16. The semiconductor package of claim 14, wherein sidewalls of the first metal layer, sidewalls of the metallic TIM layer, and sidewalls of the second metal layer are aligned.

17. The semiconductor package of claim 13, wherein the metallic TIM layer comprises solder, tin, bismuth, lead, cadmium, zinc, gallium, indium, tellurium, mercury, thallium, antimony, selenium, polonium, or a combination thereof.

18. The semiconductor package of claim 13, wherein the adhesive layer further comprises a polymeric TIM layer disposed adjacent to the first metal layer and the metallic TIM layer.

19. The semiconductor package of claim 18, wherein the polymeric TIM layer comprises acetal, acrylic, cellulose, acetate, polyethylene, polystyrene, vinyl, nylon, polyolefin, polyester, silicone, paraffin, or a combination thereof.

20. The semiconductor package of claim 13, wherein the lid further comprises a second protruding portion connected to the body portion, the second protruding portion is attached to the semiconductor die, the second protruding portion is spatially separated from the first protruding portion, and the first protruding portion laterally surrounds the adhesive layer.

* * * * *